(12) United States Patent
Karkkainen et al.

(10) Patent No.: US 9,735,805 B2
(45) Date of Patent: Aug. 15, 2017

(54) ENCODER, DECODER AND METHOD

(71) Applicant: GURULOGIC MICROSYSTEMS OY, Turku (FI)

(72) Inventors: Tuomas Karkkainen, Turku (FI); Ossi Kalevo, Akaa (FI)

(73) Assignee: Gurulogic Microsystems Oy (FI)

( * ) Notice: Subject to any disclaimer, the term of this patent is extended or adjusted under 35 U.S.C. 154(b) by 0 days.

(21) Appl. No.: 15/321,175

(22) PCT Filed: Jun. 26, 2015

(86) PCT No.: PCT/EP2015/025042
§ 371 (c)(1),
(2) Date: Dec. 21, 2016

(87) PCT Pub. No.: WO2015/197202
PCT Pub. Date: Dec. 30, 2015

(65) Prior Publication Data
US 2017/0155402 A1    Jun. 1, 2017

(30) Foreign Application Priority Data
Jun. 27, 2014 (GB) .................................. 1411531.5

(51) Int. Cl.
*H03M 7/30* (2006.01)
(52) U.S. Cl.
CPC ....... *H03M 7/3095* (2013.01); *H03M 7/6005* (2013.01); *H03M 7/6011* (2013.01); *H03M 7/6058* (2013.01)
(58) Field of Classification Search
None
See application file for complete search history.

(56) References Cited

U.S. PATENT DOCUMENTS

| | | | |
|---|---|---|---|
| 5,414,425 A * | 5/1995 | Whiting | G06T 9/005 341/106 |
| 5,434,568 A | 7/1995 | Moll | |

(Continued)

FOREIGN PATENT DOCUMENTS

| | | |
|---|---|---|
| EP | 2 256 934 A1 | 12/2010 |
| GB | 2509055 A | 6/2014 |
| GB | 2511355 A | 9/2014 |
| GB | 2527588 A | 12/2015 |

(Continued)

OTHER PUBLICATIONS

International Search Report issued in International Application No. PCT/EP2015/025042 with Date of mailing Sep. 28, 2015.

(Continued)

*Primary Examiner* — Howard Williams
(74) *Attorney, Agent, or Firm* — Eric L. Sophir; Dentons US LLP

(57) ABSTRACT

An encoder for encoding input data to generate corresponding encoded data includes data processing hardware which is operable:

to determine at least partial reoccurrences of data blocks or data packets within the input data, wherein the data blocks or data packets include a plurality of bytes;
    to employ at least one reference symbol to relate reoccurrences of mutually similar data blocks or data packets and/or to indicate whether or not there are reoccurrences of mutually similar data blocks or data packets within the input data;
    to employ a plurality of change symbols, for example a plurality of mask bits, to indicate changed and unchanged data elements of partial reoccurrences of data blocks or data packets within the input data and a change of data values of changed data elements; and
    to encode the at least one reference symbol and the plurality of change symbols into the encoded data.

26 Claims, 7 Drawing Sheets

(56) References Cited

U.S. PATENT DOCUMENTS

| | | | |
|---|---|---|---|
| 7,643,505 | B1 | 1/2010 | Colloff |
| 9,532,066 | B2 * | 12/2016 | Chien .................... H04N 19/52 |
| 2010/0115137 | A1 | 5/2010 | Kim et al. |
| 2010/0125553 | A1 | 5/2010 | Huang et al. |
| 2013/0315307 | A1 | 11/2013 | Karkkainen et al. |
| 2014/0075150 | A1 | 3/2014 | Abali et al. |
| 2014/0075152 | A1 | 3/2014 | Abali et al. |
| 2014/0161119 | A1 | 6/2014 | Emmanuel |

FOREIGN PATENT DOCUMENTS

| | | | |
|---|---|---|---|
| NO | 2010/056265 | A1 | 5/2010 |
| NO | 2016/012105 | A1 | 1/2016 |

OTHER PUBLICATIONS

Written Opinion of the International Searching Authority issued in International Application No. PCT/EP2015/025042 with Date of mailing Sep. 28, 2015.

Entropy (information theory)—Wikipedia, the free encyclopedia (accessed Sep. 27, 2013). URL, http://en.wikipedia.org/wiki/Entropy_%28information_theory%29, pp. 1-16.

Shannon, Claude E. (1948) (accessed Nov. 28, 2012) A Mathematical Theory of Communication. URL: http://cm.bell-labs.com/cm/ms/what/shannonday/shannon1948.pdf, pp. 1-55.

Lossless compression—Wikipedia, the free encyclopedia (accessed Sep. 27, 2013). URL: http://en.wikipedia.org/wiki/Lossless_compression, pp. 1-11.

Lossy compression—Wikipedia, the free encyclopedia (accessed Sep. 27, 2013). URL: http://en.wikipedia.org/wiki/Lossy_compression, pp. 1-9.

Data deduplication—Wikipedia, the free encyclopedia (accessed Sep. 27, 2013). URL: http://en.wikipedia.org/wiki/Data_deduplication, pp. 1-3.

Hypertext Transfer Protocol—HTTP/1.1 (accessed Sep. 27, 2013). URL: http://www.w3.org/Protocols/rfc2616/rfc2616.html, pp. 1-7.

Real-Time Messaging Protocol (RTMP) specification | Adobe Developer Connection (accessed Sep. 27, 2013). URL: http://www.adobe.com/devnet/rtmp.html, one page.

Windows Azure: Microsoft's Cloud Platform | Cloud Hosting | Cloud Services (accessed Sep. 27, 2013). URL: http://www.windowsazure.com/en-us/, pp. 1-9.

Moore's law—Wikipedia, the free encyclopedia (accessed Sep. 27, 2013). URL: http://en.wikipedia.org/wiki/Moore%27s_law, p. 1-17.

* cited by examiner

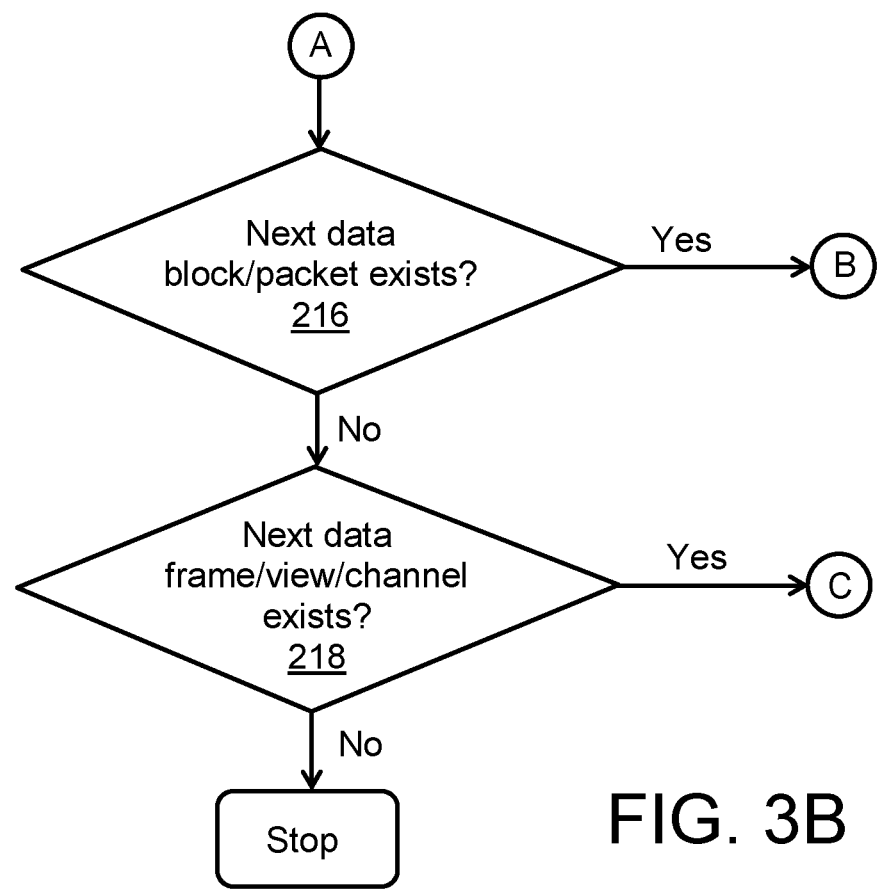

ENCODER, DECODER AND METHOD

CROSS-REFERENCE TO RELATED APPLICATIONS

This application is a National Stage of PCT/EP2015/025042, filed Jun. 26, 2015, which claims priority under 35 U.S.C. §119 to GB Application No. 1411531.5, filed Jun. 27, 2014, now patent No. GB 2527607 issued on May 10, 2016 all of which are incorporated herein by reference in their entirety.

TECHNICAL FIELD

The present disclosure relates to encoders for encoding input data (D1) to generate corresponding encoded data (E2); the present disclosure also relates to methods of encoding input data (D1) to generate corresponding encoded data (E2). Moreover, the present disclosure concerns decoders for decoding encoded data (E2) to generate corresponding decoded data (D3); the present disclosure also concerns methods of decoding encoded data (E2) to generate corresponding decoded data (D3). Furthermore, the present disclosure is concerned with computer program products comprising a non-transitory computer-readable storage medium having computer-readable instructions stored thereon, the computer-readable instructions being executable by a computerized device comprising processing hardware to execute aforesaid methods. Additionally, the present disclosure concerns codecs including at least one aforementioned encoder and at least one aforementioned decoder.

BACKGROUND

Various known documents providing a technological background for the present disclosure are listed in the APPENDIX associated with the present disclosure.

Generally, algorithms used to compress data are based either on a lossless compression method [3] or on a lossy compression method [4]. In lossless compression, various files, namely data (D1), are compressed in such a manner that the data (D1) can later be recovered as it was originally.

Conventionally, it is known to employ data de-duplication methods [5] when encoding the data (D1), which attempt to eliminate duplicate copies of segments of data in the data (D1), namely those data segments which have not changed when they repetitively reoccur when the data (D1) is, for example, temporally streamed. Known data de-duplication methods are able to find efficiently such data blocks that are exactly similar to a desired data block.

Generally, known data de-duplication methods recognize previously occurring data segments by using various different methods, such as:
(i) by detecting a number of changed data elements in a given data segment relative to a reference data segment;
(ii) by computing a sum of absolute differences between data elements of the given data segment and the reference data segment;
(iii) by utilizing redundancy check tables; or
(iv) by employing sliding-block methods.

Entire files can also be de-duplicated, in which case a symbol used to replace duplicate files produces an excellent compression ratio [5].

Moreover, data de-duplication can be executed in a post-processed manner, in which case associated data processing is performed retroactively after the data (D1) has been written. Alternatively, data de-duplication can be performed in real-time, namely just as the data (D1) enters a given system, in which case a given recognized data block is not written at all, but instead, a reference is made to an earlier data block which is mutually similar to the given recognized data block.

Data de-duplication is used in various branches of contemporary information technology industry, such as in data storage and in data transfer networks. For example, data de-duplication is used in cloud services, in system backup copying and in e-mail servers, wherein mutually similar files, or only slightly changed substantially mutually similar files, are transferred continuously. Moreover, in Internet communication networks, where responses to requests are sent, data bytes are transmitted back and forth, and those bytes mostly contain partly or entirely the same Internet Protocol (IP) packet data; data de-duplication is relevant to Wide Area Network (WAN) Optimization, for example.

It is well-known previously that known data de-duplication methods are more cost-efficient in comparison to traditional data compression methods. However, the known data de-duplication methods suffer from several disadvantages. Firstly, the known de-duplication methods often use considerable data memory and processing power as they attempt to achieve a desired data compression ratio. Generally, an associated search area, namely an amount of memory used to find similarities, needs to be increased to improve the data compression ratio. Moreover, CPU-intensive methods, such as a sliding search method, need to be used to improve the data compression ratio. The sliding search method seeks to identify a target data block or data packet in a raw fashion by shifting inside a search area to a direction pointed to by an algorithm employed for implementing the sliding search method.

Secondly, the known data de-duplication methods are not able to find such data blocks or data packets whose content has changed slightly, but which still contains a lot of unchanged data elements relative to the desired data block.

Thirdly, the known data de-duplication methods potentially result in data fragmentation, especially when the processing associated with these de-duplication methods is executed in real time.

SUMMARY

The present disclosure seeks to provide an improved encoder employing de-duplication techniques that are capable of providing improved encoding performance.

Moreover, the present disclosure seeks to provide an improved decoder employing duplication techniques that are capable of providing improved decoding performance.

In a first aspect, embodiments of the present disclosure provide an encoder for encoding input data (D1) to generate corresponding encoded data (E2), characterized in that the encoder includes data processing hardware which is operable:
(a) to determine at least partial reoccurrences of data blocks or data packets within the input data (D1), wherein the data blocks or data packets each include a plurality of bytes;
(b) to employ at least one reference symbol to relate reoccurrences of mutually similar data blocks or data packets within the input data (D1), and/or to indicate whether or not there are reoccurrences of mutually similar data blocks or data packets within the input data (D1), wherein a given reference symbol is employed as a relative pointer that indicates a position of a given data block or data packet relative to its corresponding reference data block or data packet, or is employed to indicate a position of the reference data block or data packet relative to the given data block or data packet;

(c) to employ a plurality of change symbols to indicate changed and unchanged data elements of partial reoccurrences of data blocks or data packets within the input data (D1), wherein the plurality of change symbols are implemented by way of mask bits or a change of data values of the data elements; and (d) to encode into the encoded data (E2):
(i) the at least one reference symbol,
(ii) the plurality of change symbols, and
(iii) data values indicative of the changed data elements or data values indicative of the change of data values of the changed data elements, when the plurality of change symbols are implemented by way of mask bits into the encoded data (E2).

The data processing hardware of the encoder is operable to determine at least partial reoccurrences of data blocks or data packets within the input data (D1). For this purpose, the data processing hardware of the encoder is optionally operable to determine a most optimal size for the data blocks or data packets. Additionally, the data processing hardware of the encoder is optionally operable to provide, within the encoded data (E2), information indicative of the most optimal size for the data blocks or data packets.

Moreover, the data processing hardware of the encoder is operable to employ at least one reference symbol to relate reoccurrences of mutually similar data blocks or data packets and/or to indicate whether or not there are reoccurrences of mutually similar data blocks or data packets within the input data (D1).

Optionally, the data processing hardware of the encoder is operable to encode into a plurality of data streams to provide the encoded data (E2):
(i) the at least one reference symbol,
(ii) the plurality of change symbols, and
(iii) the data values indicative of the changed data elements or the data values indicative of the change of data values of the changed data elements, when the plurality of change symbols are implemented by way of mask bits.

It will be appreciated that the "change symbol" always contains all information that is necessary for expressing that the value has changed, and also for expressing how that particular value or its delta change will be transmitted further. That is, if delta/ODelta values are used, then there will be only one value added into the change symbol, and only into that symbol. Such single values can then, of course, be inserted into a stream of values that contains those delta/ODelta values, whereas if a bit/flag indicating change/no change is added to the change symbol, then there will be two values instead of one, which can then of course be inserted into two streams. One of these streams will contain the bits/flags indicating change/no-change, and the second stream will then contain either the new values as such, or as difference values in relation to the value that the block/packet to be duplicated had in that same position.

With regard to the "reference symbol", it expresses whether or not a block or packet has been duplicated, and also which block/packet is used in that partial or entire duplication. That is, a value '0' in relative referencing or the block's own index or pointer in direct referencing indicates that the block will not be duplicated. Other values then indicate where the reoccurrence of that block or packet can be found, using either direct or relative referencing. Both direct and relative referencing can be executed with different grades of precision; in other words, the addresses/indexes may be addresses/indexes to a byte/word/block/packet. Of course, it is also possible in direct referencing to use such a value which otherwise would not be a possible location for a reoccurrence, to indicate that the block/packet in question was not duplicated. As compared to using the block's own index/pointer, using an impossible direct reference value yields one particular advantage, namely the value will always be the same, namely it can be entropy-compressed better for example. Such impossible values in direct referencing are, for example, negative values or values that occur outside a range of the block/packet. In indirect referencing, the aforesaid zero value "0" always indicates a good (namely possible) value, because it will be the same each time, and relatively it always points to that same block, and thus it will be easy to identify that the block/packet in question cannot have a reoccurring block/packet.

Moreover, the encoder is operable to employ a plurality of change symbols in (c) as a plurality of mask bits to indicate changed and unchanged data elements (values) of partial reoccurrences of data blocks or data packets within the input data (D1) and also the changed values. Alternatively, change symbols can contain information regarding changed or not-changed values and also change of values within delta values.

Alternatively, optionally, the data processing hardware of the encoder is operable to represent one or more unchanged data elements of a given data block or data packet by using one or more values indicative of no change, wherein the one or more values are different to those present in the input data (D1).

Moreover, the data processing hardware of the encoder is operable to encode the at least one reference symbol and the plurality of change symbols, for example mask bits, into the encoded data (E2). Optionally, the processing hardware of the encoder is operable to encode the at least one reference symbol and the plurality of change symbols, for example mask bits, into a plurality of data streams to provide the encoded data (E2).

Optionally, the data processing hardware of the encoder is operable to encode the input data (D1) provided as at least one of: one dimensional data, multi-dimensional data, audio data, image data, video data, sensor data, text data, binary data, medical data.

Optionally, the encoder includes an additional encoding unit for encoding into the encoded data (E2) at least a portion of:
(i) the at least one reference symbol,
(ii) the plurality of change symbols, and
(iii) the data values indicative of the changed data elements or the data values indicative of the change of data values of the changed data elements, when the plurality of change symbols are implemented by way of mask bits,
wherein the additional encoding unit is operable to employ at least one of: entropy modifying encoding, delta encoding, ODelta encoding, range encoding, Run Length Encoding (RLE), Split RLE (SRLE), interpolation encoding.

Moreover, optionally, the encoder includes an additional encoding unit for encoding at least a portion of the at least one reference symbol and the plurality of change symbols into the encoded data (E2). This additional encoding unit is optionally operable to employ at least one of: entropy modifying encoding, delta encoding, ODelta encoding as described in a patent application GB1303661.1 filed on 1 Mar. 2013, ODelta coding with different predictors as described in a patent application GB1412937.3, filed on 21 Jul. 2014, 1 u or 8 u range encoding, Run Length Encoding (RLE), Split RLE (SRLE) as described in a patent application GB130360.3 filed on 1 Mar. 2013, interpolation encoding.

Embodiments of the present disclosure are of advantage in that the encoder is capable, by way of its approach to implementing de-duplication, of providing enhanced encoding performance.

In a second aspect, embodiments of the present disclosure provide a method of encoding input data (D1) to generate corresponding encoded data (E2), wherein the method includes processing the input data (D1), characterized in that the method includes:

(a) determining at least partial reoccurrences of data blocks or data packets within the input data (D1), wherein the data blocks or data packets each include a plurality of bytes;

(b) employing at least one reference symbol to relate reoccurrences of mutually similar data blocks or data packets within the input data (D1), and/or to indicate whether or not there are reoccurrences of mutually similar data blocks or data packets within the input data (D1), wherein a given reference symbol is employed as a relative pointer that indicates a position of a given data block or data packet relative to its corresponding reference data block or data packet, or is employed to indicate a position of the reference data block or data packet relative to the given data block or data packet;

(c) employing a plurality of change symbols to indicate changed and unchanged data elements of partial reoccurrences of data blocks or data packets within the input data (D1), wherein the plurality of change symbols are implemented by way of mask bits or a change of data values of the data elements; and (d) encoding into the encoded data (E2):
   (i) the at least one reference symbol,
   (ii) the plurality of change symbols, and
   (iii) data values indicative of the changed data elements or data values indicative of the change of data values of the changed data elements, when the plurality of change symbols are implemented by way of mask bits.

Optionally, the method includes representing one or more unchanged data elements of a given data block or data packet by using one or more values indicative of no change, wherein the one or more values are different to those present in the input data (D1).

Optionally, the method includes encoding into a plurality of data streams to provide the encoded data (E2):
   (i) the at least one reference symbol,
   (ii) the plurality of change symbols, and
   (iii) the data values indicative of the changed data elements or the data values indicative of the change of data values of the changed data elements, when the plurality of change symbols are implemented by way of mask bits.

Optionally, the method includes encoding the input data (D1) provided as at least one of: one-dimensional data, multi-dimensional data, audio data, image data, video data, sensor data, text data, binary data, medical data.

Optionally, the method includes:
(e) employing an additional encoding unit for encoding into the encoded data (E2) at least a portion of:
   (i) the at least one reference symbol,
   (ii) the plurality of change symbols, and
   (iii) the data values indicative of the changed data elements or the data values indicative of the change of data values of the changed data elements, when the plurality of change symbols are implemented by way of mask bits; and
(f) arranging for the additional encoding unit to employ at least one of: entropy modifying encoding, delta encoding, ODelta encoding, range encoding, Run Length Encoding (RLE), Split RLE (SRLE), interpolation encoding.

More optionally, the method includes:
(g) determining a most optimal size for the data blocks or data packets when processing the input data (D1); and
(h) providing, within the encoded data (E2), information indicative of the most optimal size for the data blocks or data packets.

In a third aspect, embodiments of the present disclosure provide a computer program product comprising a non-transitory (namely non-transient) computer-readable storage medium having computer-readable instructions stored thereon, the computer-readable instructions being executable by a computerized device comprising processing hardware to execute the aforementioned method.

In a fourth aspect, embodiments of the present disclosure provide a decoder for decoding encoded data (E2) to generate corresponding decoded data (D3), characterized in that the decoder includes data processing hardware which is operable:

(a) to decode the encoded data (E2) to identify:
   (i) at least one reference symbol,
   (ii) a plurality of change symbols, the plurality of change symbols indicating changed and unchanged data elements of partial reoccurrences of data blocks or data packets within the decoded data (D3), the plurality of change symbols being implemented by way of mask bits or a change of data values of the data elements, and
   (iii) data values indicative of the changed data elements or data values indicative of the change of data values of the changed data elements, when the plurality of change symbols are implemented by way of mask bits;

(b) to employ the at least one reference symbol to determine whether or not there are reoccurrences of mutually similar data blocks or data packets and to generate data for reoccurrences of mutually similar data blocks or data packets within the decoded data (D3), wherein a given reference symbol is employed as a relative pointer that indicates a position of a given data block or data packet relative to its corresponding reference data block or data packet, or is employed to indicate a position of the reference data block or data packet relative to the given data block or data packet, and wherein the data blocks or data packets each include a plurality of bytes;

(c) to employ the plurality of change symbols to generate data for the changed data elements of the partial reoccurrences of data blocks or data packets within the decoded data (D3); and (d) to assemble the data generated for the reoccurrences of mutually similar data blocks or data packets and the data generated for the changed data elements of the partial reoccurrences of data blocks or data packets, to generate corresponding decoded data (D3).

Optionally, the data processing hardware of the decoder is operable to receive, within the encoded data (E2), information indicative of a size of data blocks or data packets.

The data processing hardware of the decoder is operable to decode the encoded data (E2) to identify at least one reference symbol and a plurality of change symbols. Optionally, the data processing hardware of the decoder is operable to decode from plurality of data streams provided within the encoded data (E2):

(i) the at least one reference symbol,
(ii) the plurality of change symbols, and
(iii) the data values indicative of the changed data elements or the data values indicative of the change of data values of the changed data elements, when the plurality of change symbols are implemented by way of mask bits.

Optionally, in the decoder the decoded data (D3) is provided as at least one of: one-dimensional data, multi-dimensional data, audio data, image data, video data, sensor data, text data, binary data, medical data.

the decoder includes an additional decoding unit for decoding from the encoded data (E2) at least a portion of:
(i) the at least one reference symbol,
(ii) the plurality of change symbols, and
(iii) the data values indicative of the changed data elements or the data values indicative of the change of data values of the changed data elements, when the plurality of change symbols are implemented by way of mask bits,
wherein the additional decoding unit is operable to employ at least one of: entropy modifying decoding, delta decoding, ODelta decoding, range decoding, run length decoding, split run length decoding, interpolation decoding.

Optionally, the data processing hardware of the decoder is operable to receive, within the encoded data (E2), information indicative of a size of the data blocks or data packets.

Alternatively, optionally, the data processing hardware of the decoder is operable to decode one or more unchanged data elements of a given data block or data packet from one or more values indicative of no change, wherein the one or more values are different to those present in the decoded data (D3).

In a fifth aspect, embodiments of the present disclosure provide a simple and fast method of decoding encoded data (E2) to generate corresponding decoded data (D3), wherein the method includes processing the encoded data (E2), characterized in that the method includes:
(a) decoding the encoded data (E2) to identify:
  (i) at least one reference symbol,
  (ii) a plurality of change symbols, the plurality of change symbols indicating changed and unchanged data elements of partial reoccurrences of data blocks or data packets within the decoded data (D3), the plurality of change symbols being implemented by way of mask bits or a change of data values of the data elements, and
  (iii) data values indicative of the changed data elements or data values indicative of the change of data values of the changed data elements, when the plurality of change symbols are implemented by way of mask bits;
(b) employing the at least one reference symbol to determine whether or not there are reoccurrences of mutually similar data blocks or data packets and to generate data for reoccurrences of mutually similar data blocks or data packets within the decoded data (D3), wherein a given reference symbol is employed as a relative pointer that indicates a position of a given data block or data packet relative to its corresponding reference data block or data packet, or is employed to indicate a position of the reference data block or data packet relative to the given data block or data packet, and wherein the data blocks or data packets each include a plurality of bytes;
(c) employing the plurality of change symbols to generate data for the changed data elements of the partial reoccurrences of data blocks or data packets within the decoded data (D3); and
(d) assembling the data generated for the reoccurrences of mutually similar data blocks or data packets and the data generated for the changed data elements of the partial reoccurrences of data blocks or data packets, to generate corresponding decoded data (D3).

Optionally, the method includes decoding one or more unchanged data elements of a given data block or data packet from one or more values indicative of no change, wherein the one or more values are different to those present in the decoded data (D3).

Optionally, the method includes decoding from a plurality of data streams provided within the encoded data (E2):
(i) the at least one reference symbol,
(ii) the plurality of change symbols, and
(iii) the data values indicative of the changed data elements or the data values indicative of the change of data values of the changed data elements, when the plurality of change symbols are implemented by way of mask bits.

Optionally, the decoded data (D3) is provided as at least one of: one-dimensional data, multi-dimensional data, audio data, image data, video data, sensor data, text data, binary data.

More optionally, the method includes:
(e) employing an additional decoding unit for decoding from the encoded data (E2) at least a portion of:
  (i) the at least one reference symbol,
  (ii) the plurality of change symbols, and
  (iii) the data values indicative of the changed data elements or the data values indicative of the change of data values of the changed data elements, when the plurality of change symbols are implemented by way of mask bits; and
(f) arranging for the additional decoding unit to employ at least one of: entropy modifying decoding, delta decoding, ODelta decoding, range decoding, run length decoding, split run length decoding, interpolation decoding.

Optionally, the method includes receiving, within the encoded data (E2), information indicative of a size of the data blocks or data packets.

In a sixth aspect, embodiments of the present disclosure provide a computer program product comprising a non-transitory (namely non-transient) computer-readable storage medium having computer-readable instructions stored thereon, the computer-readable instructions being executable by a computerized device comprising processing hardware to execute the aforementioned method.

In a seventh aspect, embodiments of the present disclosure provide a codec including the aforementioned encoder and the aforementioned decoder.

Additional aspects, advantages, features and objects of the present disclosure would be made apparent from the drawings and the detailed description of the illustrative embodiments construed in conjunction with the appended claims that follow.

It will be appreciated that features of the present disclosure are susceptible to being combined in various combinations without departing from the scope of the present disclosure as defined by the appended claims.

DESCRIPTION OF THE DRAWINGS

The summary above, as well as the following detailed description of illustrative embodiments, is better understood when read in conjunction with the appended drawings. For the purpose of illustrating the present disclosure, exemplary constructions of the disclosure are shown in the drawings. However, the present disclosure is not limited to specific methods and apparatus disclosed herein. Moreover, those in the art will understand that the drawings are not to scale. Wherever possible, like elements have been indicated by identical numbers.

Embodiments of the present disclosure will now be described, by way of example only, with reference to the following diagrams wherein:

FIGS. 3A and 3B collectively are an illustration of steps of an encoding process, in accordance with an embodiment of the present disclosure;

In the accompanying diagrams, an underlined number is employed to represent an item over which the underlined number is positioned or an item to which the underlined number is adjacent. A non-underlined number relates to an item identified by a line linking the non-underlined number to the item. When a number is non-underlined and accompanied by an associated arrow, the non-underlined number is used to identify a general item at which the arrow is pointing.

DETAILED DESCRIPTION OF EMBODIMENTS

The following detailed description illustrates embodiments of the present disclosure and ways in which they can be implemented. Although the best mode of carrying out the present disclosure has been disclosed, those skilled in the art would recognize that other embodiments for carrying out or practicing the present disclosure are also possible.

In overview, embodiments of the present disclosure are concerned with methods of processing data, and apparatus for performing such processing of data, wherein data de-duplication and duplication are performed, as will be elucidated in greater detail below.

Figure 1:
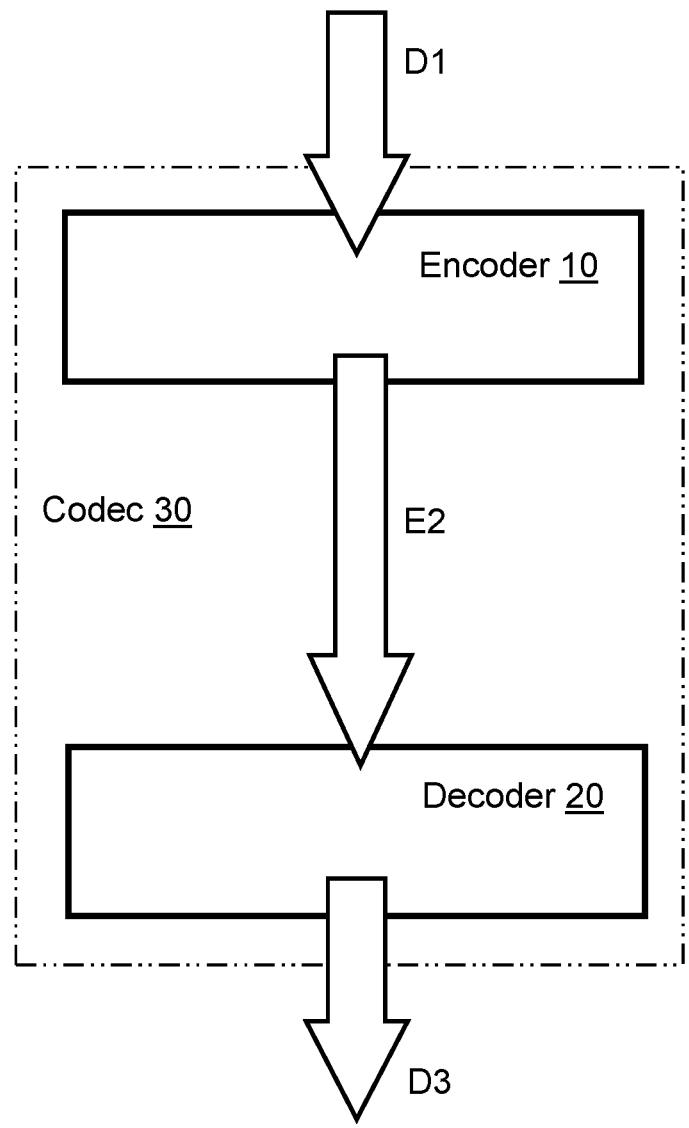
FIG. 1 is a schematic illustration of an encoder for encoding input data (D1) to generate corresponding encoded data (E2) and a decoder for decoding the encoded data (E2) to generate corresponding decoded data (D3), wherein the encoder and the decoder collectively form a codec, in accordance with an embodiment of the present disclosure.

Referring to FIG. 1, embodiments of the present disclosure concern:
(i) an encoder 10 for encoding input data (D1) to generate corresponding encoded data (E2), and corresponding methods of encoding the input data (D1) to generate the encoded data (E2);
(ii) a decoder 20 for decoding the encoded data (E2) to generate corresponding decoded data (D3), and corresponding methods of decoding the encoded data (E2) to generate the decoded data (D3); and
(iii) a codec 30 including a combination of at least one encoder and at least one decoder, namely a combination of the encoder 10 and the decoder 20.

Optionally, the decoded data (D3) is exactly similar to the input data (D1), as in a lossless mode of operation. Alternatively, optionally, the decoded data (D3) is approximately similar to the input data (D1), as in a lossy mode of operation. Yet alternatively, optionally, the decoded data (D3) is different to the input data (D1), for example by way of a transformation, but retains substantially similar information present in the input data (D1); for example, the decoded data (D3) is usefully made different to the input data (D1) when reformatting of the data (D3) is also required, for example to be compatible with different types of communication platform, software layer, type of communication device, and so forth. Although some embodiments of the present disclosure are described in respect of image data present in the input data (D1), namely subject to representation via use of mask bits, it will be appreciated that embodiments of the present disclosure are capable of encoding a wide variety of mutually different types of input data (D1), for example sensor data, For purposes of generalizing for all types of data, a term "change symbol" is employed, for example in the appended claims, which, in the special example case of the input data (D1) including image data, the data symbols are implemented as mask bits.

The encoder 10 includes processing hardware for processing the input data (D1). Optionally, the processing hardware of the encoder 10 is operable to encode the input data (D1) provided as at least one of: one-dimensional data, multi-dimensional data, audio data, image data, video data, sensor data, text data, binary data, medical data but not limited thereto. Optionally, the input data (D1) is received as a stream or a file. Optionally, the input data (D1) includes a lot of small variations, for example a mixture of structured details and noise.

The processing hardware of the encoder 10 is operable to determine at least partial reoccurrences of data blocks or data packets within the input data (D1). For this purpose, the processing hardware of the encoder 10 is optionally operable to determine a most optimal size for the data blocks or data packets, as will be elucidated in greater detail below. Additionally, the processing hardware of the encoder 10 is optionally operable to provide, within the encoded data (E2), information indicative of the most optimal size for the data blocks or data packets.

In order to determine the at least partial reoccurrences of data blocks or data packets, the processing hardware of the encoder 10 is operable to employ one or more redundancy checks using one or more suitable redundancy checking methods. Optionally, a redundancy checking method is employed to select a data block or data packet that maximises a count of unchanged data elements, or minimizes a sum of absolute errors between data elements of the data block or data packet and data elements of a corresponding reference data block or data packet.

Additionally, optionally, the redundancy checking method is employed to compute one or more redundancy-check values for a given data block or data packet. In an example, a single long redundancy-check value is calculated for the given data block or data packet. In another example, multiple short redundancy-check values are calculated for the given data block or data packet.

If a redundancy-check value computed for the given data block or data packet does not match with any previously stored information sufficiently well, then the given data block or data packet is identified as a non-duplicate data block or data packet. This non-duplicate data block or data packet is written or delivered as it is in the encoded data (E2). Additionally, optionally, the non-duplicate data block or data packet can also be inserted as a new reference data block or data packet into a stored information sequence for redundancy checking purposes.

Beneficially, the redundancy-check values can be computed in various ways, but a main consideration is that they should be able to distinguish non-duplicate data blocks or data packets with sufficient precision. However, it will be appreciated that it is not advantageous to waste computing resources of the processing hardware of the encoder 10 by computing an unnecessarily precise redundancy-check value, if a given task can be implemented by using an optimized algorithm, which is less computation and data memory resource-intensive.

Moreover, the processing hardware of the encoder 10 is operable to employ at least one reference symbol to relate reoccurrences of mutually similar data blocks or data packets and/or to indicate whether or not there are reoccurrences of mutually similar data blocks or data packets within the input data (D1). In this regard, the processing hardware of the encoder 10 is optionally operable to employ one or more pointers for indicating one or more at least partial reoccurrences of data blocks or data packets relative to their corresponding reference data block or data packet. Thus, the at least one reference symbol is employed as the one or more pointers that point to the corresponding reference data block or data packet.

Optionally, the one or more pointers are one or more relative pointers that indicate relative distances of the one or more at least partial reoccurrences of data blocks or data packets from the corresponding reference data block or data packet within the input data (D1). In other words, the one or more pointers optionally indicate positions of the one or more at least partial reoccurrences of data blocks or data packets relative to the corresponding reference data block or data packet within the input data (D1).

Optionally, the one or more pointers include reference addresses to particular locations, where information pertaining to their corresponding reference data blocks or data packets can be obtained. Optionally, the one or more pointers include reference addresses to a piece of information that needs to be used when decoding the encoded data (E2) to reconstruct the decoded data (D3). In other words, the one or more pointers point to data memory locations of their corresponding reference data blocks or data packets.

Moreover, optionally, the one or more pointers are expressed as at least one of: byte-accurate pointers (namely direct addressing), data-value-accurate pointers, word-accurate pointers, or block-accurate pointers (namely addressing based on a number of a given block). Optionally, indicating the place of reoccurrence (namely "pointer") can take place in a relative manner, such as with help of relative per-block symbol values (namely by employing a relative block-accurate shift), relative byte-accurate shift, relative data-value-accurate shift, relative word-accurate shift and so forth.

Moreover, the processing hardware of the encoder 10 is operable to employ a plurality of change symbols as a plurality of mask bits comprising bits/flags to indicate changed and unchanged data elements, namely values, of partial reoccurrences of data blocks or data packets and also changed values within the input data (D1). Optionally, a mask bit associated with an unchanged data element is set to a '0' value, while a mask bit associated with a changed data element is set to a '1' value, or vice versa. Thus, the plurality of mask bits describe which data elements are changed and which data elements are unchanged. Alternatively, the change symbols contain information regarding changed or not-changed values, and also change of values within delta values. Optionally, the delta value is assigned a zero "0" value for indicating not-changed, and a non-zero value for indicating change.

Alternatively, optionally, the processing hardware of the encoder 10 is operable to represent one or more unchanged data elements of a given data block or data packet by using one or more values indicative of no change, wherein the one or more values are different to those present in the input data (D1).

Moreover, the processing hardware of the encoder 10 is operable to encode the at least one reference symbol and the plurality of change symbols into the encoded data (E2). Optionally, the processing hardware of the encoder 10 is operable to encode the at least one reference symbol and the plurality of change symbols into a plurality of data streams to provide the encoded data (E2).

The changed data elements are written or transmitted as such if a lossless mode of operation is used. If a lossy mode of operation is used, the changed data elements are quantized.

If a near-lossless mode of operation is used, at least a portion of the changed data elements is quantized. For this purpose, the processing hardware of the encoder 10 is optionally operable to quantize only some portions of the changed data elements, based on an analysis of content, type and/or composition of the input data (D1). Consequently, the encoder 10 is capable of adaptively varying a data compression ratio between the input data (D1) and the encoded data (E2).

Moreover, the changed data elements are encoded, for example, as at least one of: original data values, quantized original data values, delta values, quantized delta values, ODelta values, or quantized ODelta values. Herein, "ODelta" refers to a differential form of encoding based upon wraparound in a binary counting regime, for example as described in patent document GB1303661.1, hereby incorporated by reference.

Optionally, when original values, delta values or ODelta values are used to write and deliver changed data elements with respect to a reference data block or data packet, the unchanged data elements are, for example, set to a value of "0", indicating no change, or to a value that is not otherwise present in the data. The latter option is a better solution when original values are used, but it requires delivery of the value that is not otherwise present in the data. Subsequently, a changed data element is set either to its original data value or to a delta value, namely a data value that is equal to a difference between the original data value and a corresponding data value in the reference frame, block or packet, with or without quantization. If the changed data element is set to its original data value, and that data value happens to be equal to "0", and "0" is also used to indicate unchanged data elements, then a confusion, namely a data ambiguity, potentially occurs. Therefore, the latter option is preferable to employ in embodiments of the present disclosure, namely using a data value that is not otherwise present in the data to avoid such ambiguity. Then, the data value that is used to indicate the unchanged data elements is delivered in encoded data (E2). A method described in GB1411451.6 is a good example of a method that can be used with this embodiment of the present disclosure, when a reference symbol is used to indicate the reference data block or data packet, for example some previous data block or data packet.

If the lossy mode of operation is used, namely a form of quantization is used, and reference symbols are simultaneously updated or added, then beneficially the processing hardware of the encoder 10 takes into account, when forming the reference blocks, those changes that de-quantization will cause to corresponding decoded data (D3). The effect of quantization is also beneficially taken into account when determining a data value to be used to indicate the unchanged data elements when changed data elements are delivered with quantized original values. When quantized delta values or quantized ODelta values are used for delivery of changed data elements, then the quantization beneficially do not change the changed values to zero when zero is used for unchanged data elements.

Moreover, optionally, the encoder 10 includes an additional encoding unit for encoding at least a portion of the at least one reference symbol and the plurality of change symbols into the encoded data (E2). This additional encoding unit is optionally operable to employ at least one of: entropy modifying encoding, delta encoding, ODelta encoding, 1 u or 8 u range encoding, Run Length Encoding (RLE), Split RLE (SRLE), interpolation encoding.

Furthermore, optionally, the encoder 10 is operable to communicate the encoded data (E2) to a data server and/or data storage (not shown in FIG. 1) for storing in a database (not shown in FIG. 1). The data server and/or data storage is arranged to be accessible to the decoder 20, which is beneficially compatible with the encoder 10, for subsequently decoding the encoded data (E2).

In some examples, the decoder 20 is optionally operable to access the encoded data (E2) from the data server and/or data storage.

In alternative examples, the encoder 10 is optionally operable to stream the encoded data (E2) to the decoder 20, either via a communication network or via a direct connection. Moreover, it is to be noted that a device equipped with a hardware-based or software-based encoder can also communicate directly with another device equipped with a hardware-based or software-based decoder.

In yet other alternative examples, the decoder 20 is optionally implemented so as to retrieve the encoded data (E2) from a non-transitory (namely non-transient) computer-readable storage medium, such as a hard drive and a Solid-State Drive (SSD).

The decoder 20 includes processing hardware for processing the encoded data (E2).

Optionally, the processing hardware of the decoder 20 is operable to receive, within the encoded data (E2), information indicative of a size of the data blocks or data packets.

The processing hardware of the decoder 20 is operable to decode the encoded data (E2) to identify the at least one reference symbol and the plurality of change symbols. Optionally, the processing hardware of the decoder 20 is operable to decode the at least one reference symbol and the plurality of change symbols from the plurality of data streams provided within the encoded data (E2).

Optionally, the processing hardware of the decoder 20 is operable to decode the encoded data (E2) to identify the one or more pointers indicating one or more at least partial reoccurrences of data blocks or data packets relative to their corresponding reference data packet or data block.

The processing hardware of the decoder 20 is then operable to employ the at least one reference symbol, namely the one or more pointers, to generate data for at least partial reoccurrences of data blocks or data packets within the encoded data (E2). The one or more pointers, being optionally the one or more relative pointers, enable the processing hardware of the decoder 20 to determine positions of the at least partial reoccurrences of data blocks or data packets relative to their corresponding reference data packets or data blocks.

Moreover, the processing hardware of the decoder 20 is operable to employ the plurality of change symbols as plurality of mask bits to generate data for changed data elements of partial reoccurrences of data blocks or data packets within the encoded data (E2). Alternatively, the change symbols are employed containing information regarding changed or not-changed values and also change of values within delta values.

Alternatively, optionally, the processing hardware of the decoder 20 is operable to decode one or more unchanged data elements of a given data block or data packet from one or more values indicative of no change, wherein the one or more values are different to those present in the decoded data (D3).

Subsequently, the processing hardware of the decoder 20 is operable to assemble the data generated for the at least partial reoccurrences of data blocks or data packets and the data generated for the changed data elements of the partial reoccurrences of data blocks or data packets, to generate the decoded data (D3).

Optionally, the decoded data (D3) is provided as at least one of: one-dimensional data, multi-dimensional data, audio data, image data, video data, sensor data, text data, binary data, medical data but not limited thereto.

Moreover, optionally, the decoder 20 includes an additional decoding unit for decoding at least a portion of the at least one reference symbol and the plurality of change symbols from the encoded data (E2). This additional decoding unit is optionally operable to employ at least one of: entropy modifying decoding, delta decoding, ODelta decoding, 1 u or 8 u range decoding, run length decoding, split run length decoding, interpolation decoding.

Furthermore, methods of data processing that occur in the encoder 10 and the decoder 20 optionally include sub-methods as described in respect of a patent application GB1411451.6, hereby incorporated by reference, wherein the sub-methods of this patent application are provided in Table 1.

TABLE 1

Sub-methods employed in the encoder 10 and the decoder 20

| Use Region | Sub-method Detail |
|---|---|
| Encoder 10 | A method of encoding input data (D1) to generate corresponding encoded data (E2), wherein the method includes processing the input data (D1) as data blocks and/or data packets, characterized in that the method includes:<br>(i) identifying substantial reoccurrences of data blocks and/or data packets within the input data (D1);<br>(ii) identifying where elements are unchanged within the substantially reoccurring data blocks and/or data packets, and/or where elements are changed within the substantially reoccurring data blocks and/or data packets;<br>(iii) encoding unchanged data elements in the encoded data (E2) by employing at least one corresponding symbol or at least one corresponding bit indicating an absence of change in the unchanged data elements relative to corresponding elements in a reference data block and/or data packet; and<br>(iv) encoding changed data elements in the encoded data (E2). |
| Decoder 20 | A method of decoding encoded data (E2) to generate corresponding decoded data (D3), wherein the method includes processing the encoded data (E2) as data blocks and/or data packets, characterized in that the method includes:<br>(i) decoding the encoded data (E2) to generate data for changed data elements, the changed data elements being elements that are changed within substantial reoccurrences of data blocks and/or data packets within the encoded data (E2);<br>(ii) decoding the encoded data (E2) to generate data for unchanged data elements, the unchanged data elements being elements that are unchanged within the substantial |

TABLE 1-continued

Sub-methods employed in the encoder 10 and the decoder 20

| Use Region | Sub-method Detail |
|---|---|
| | reoccurrences of data blocks and/or data packets within the encoded data (E2), wherein the unchanged data elements are represented by at least one corresponding symbol or at least one corresponding bit indicating an absence of change in the unchanged data elements relative to corresponding elements in a reference data block and/or data packet; and |
| (iii) | assembling the data generated for the changed and unchanged data elements in steps (i) and (ii) into data blocks and/or data packets to generate the decoded data (D3). |

FIG. 1 is merely an example, which should not unduly limit the scope of the claims herein. It is to be understood that the specific designation for the codec 30 is provided as an example and is not to be construed as limiting the codec 30 to specific numbers, types, or arrangements of encoders and decoders. A person skilled in the art will recognize many variations, alternatives, and modifications of embodiments of the present disclosure.

Optionally, the codec 30 is implemented within a single device. Alternatively, optionally, the codec 30 is effectively implemented between multiple devices. In an example, the codec 30 is optionally implemented as a broadcast system, wherein there is an encoder 10 at a first spatial location and a plurality of decoders 20 at a plurality of other spatial locations.

The codec 30 can be implemented as at least one of: a data codec, an audio codec, an image codec and/or a video codec. The codec 30 is capable of compressing the input data (D1) in a pre-processing stage in real time.

Moreover, the codec 30 can be implemented to provide a real-time data transfer network coding method, which considerably saves bandwidth required for data transfer, especially in such systems that are based on request-response type communications, such as Hypertext Transfer Protocol (HTTP) [6] that is used in web browsers and World Wide Web (www) servers for data transfer. In addition to the HTTP protocol, the Real-Time Messaging Protocol (RTMP) [7] is often used for real-time full-duplex data transfer in audio and video delivering services, and also in playback video services. Thus, the codec 30 is relevant to both HTTP-based data communication systems and RTMP-based data communication systems.

Moreover, optionally, the encoder 10 and the decoder 10 are operable to implement chunked transfer encoding for HTTP and/or RTMP. Optionally, the HTTP and/or RTMP employ fixed-sized data blocks and/or data packets inside requests and responses to the requests.

The codec 30 is especially well-suited for communication protocols that are used to transfer data blocks or data packets whose size is set exactly. For example, chunked transfer encoding used in HTTP is an optimal usage area, because requests and responses to the requests transferred in the chunked transfer encoding employ fixed-sized data blocks or data packets. As huge amounts of data are transmitted over the HTTP, a considerably high data compression ratio is achieved when the encoder 10 is employed to encode input data (D1) to generate corresponding encoded data (E2).

In respect of embodiments of the present disclosure, a further benefit gained by using the HTTP is that an HTTP request/response, almost without exception, contains precise information on what is being transferred and when it is being transferred. This enables selection of optimal redundancy check tables for use during encoding of the input data (D1). This potentially improves an associated data compression ratio that is achievable.

Similar to HTTP, RTMP also defines specifications regarding transfer of data blocks or data packets that have a specific defined size. On the Internet, the RTMP is often used to transfer audio, image or video information, especially in real-time communication. During a communication process, a size for a data block or data packet to be transferred is initialized at pre-set intervals according to a response time and a capacity of a transfer network employed. This potentially improves the data compression ratio that is achievable.

If transfer networks are used and a given transmitting party does not yet know whether or not an encoding method pursuant to the present disclosure is to be employed, it is possible to implement a proxy server that transforms information for a recipient of data, in which case a desired compression ratio can be achieved between a possibly slow recipient and a fast transmitter. In this scenario, the proxy server informs the recipient about unchanged data elements of at least one previously transmitted data block or data packet by sending a reference symbol along with changed data elements, and mask bits or other indication of changed and unchanged data elements in the data block or data packet to the recipient.

In an example, the proxy server is an HTTP-proxy or RTMP-proxy server, which is situated at an optimal geographical location with respect to an associated data supply service to be optimized and associated users to be served. Optionally, methods pursuant to embodiments of the present disclosure are employed to make ready-made cloud server solutions, such as Windows Azure [8], more efficient.

During the last few years (2010+), an amount of transfers of data, audio, image and video has increased so rapidly that not even Moore's Law [9] is able to follow that kind of growth. Therefore, the codec 30 is potentially very useful for making data transfers more efficient.

For illustration purposes only, there is next provided a numerical example of an encoding method as executed within the encoder 10. In this example, the input data (D1) includes data values that might correspond to separate audio packets, separate image blocks, HTTP packet headers and so forth. The input data (D1) includes five frames/blocks/packets, wherein each frame/block/packet contains 54 data values. It can be understood that the input data (D1) has 270 data values, for example from an 18×15 image that is split into 18×3 data blocks. This results into five data blocks, each of which has 54 data values. Alternatively, the input data (D1) can also be considered to be 270 data values from a certain data stream that is generated by a block encoder, for example as described in US patent document U.S. Pat. No. 8,675,731 B2, hereby incorporated by reference, for compression purposes.

The input data (D1) includes 270 data values (entropy=1428.35 bits~=179 bytes), and is represented as follows:

0, 12, 41, 157, 180, 29, 0, 16, 243, 42, 42, 172, 8, 0, 69, 0, 0, 40, 120, 250, 64, 0, 118, 6, 206, 99, 62, 241, 193, 52, 172, 16, 17, 60, 34, 201, 192, 220, 189, 31, 183, 3, 31, 254, 192, 146, 80, 16, 0, 254, 185, 9, 0, 0, 0, 12, 41, 157, 180, 29, 0, 16, 243, 42, 42, 172, 8, 0, 69, 0, 0, 40, 121, 13, 64, 0, 118, 6, 206, 80, 62, 241, 193, 52, 172, 16, 17, 60, 34, 201, 192, 220, 189, 31, 183, 3, 31, 254, 201, 204, 80, 16, 1, 2, 175, 204, 0, 0, 0, 12, 41, 157, 180, 29, 0, 16, 243, 42, 42, 172, 8, 0, 69, 0, 0, 40, 121, 17, 64, 0, 118, 6, 206, 76, 62, 241, 193, 52, 172, 16, 17, 60, 34, 201, 192, 220, 189, 31, 183, 3, 31, 254, 209, 65, 80, 16, 1, 2, 168, 87, 0, 0, 0, 12, 41, 157, 180, 29, 0, 16, 243, 42, 42, 172, 8, 0, 69, 0, 0, 40, 121, 25, 64, 0, 118, 6, 206, 68, 62, 241, 193, 52, 172, 16, 17, 60, 34, 201, 192, 220, 189, 31, 183, 3, 31, 254, 221, 164, 80, 16, 1, 2, 155, 244, 0, 0, 0, 12, 41, 157, 180, 29, 0, 16, 243, 42, 42, 172, 8, 0, 69, 0, 0, 40, 121, 67, 64, 0, 118, 6, 206, 26, 62, 241, 193, 52, 172, 16, 17, 60, 34, 201, 192, 220, 189, 31, 183, 3, 31, 254, 233, 149, 80, 16, 1, 2, 144, 3, 0, 0

The input data (D1) is optionally entropy encoded, for example to 253 bytes, by using an 8 u range encoding method. By referring to such 8 u range encoding, what is meant with this is a range coding method which is used for coding 8-bit data values in codec pursuant to the present disclosure. Range coding is explained here :http://en.wikipedia.org/wiki/Range_coding which is hereby incorporated by reference.

Now, this result includes also transmitting a probability table or a reasonably good fixed table out of currently 22 alternative fixed probability tables in codec pursuant to the present disclosure. The share of the range coded data is beneficially quite close to the entropy, namely 179 bytes in this example, if a perfect probability table were known and there would then be a need to transmit and/or approximate with a less applicable probability table.

In order to determine a most optimal size for data blocks (hereinafter referred to as "most optimal block size"), the processing hardware of the encoder 10 operates to perform an initial run with an initial block size of seven. An Initial block size is beneficially selected to be a relatively small number, for example in a range of 3 to 8, to enable accurate detection of a most optimal block size. For example, this block size of seven results in 39 data blocks as follows:

$$270 = 38 \times 7 + 4$$

wherein 38 data blocks have a size of seven data values and one last data block has a size of four data values.

For a given data block, a reference symbol '1' is used for a corresponding reference data block that arrives one data block before the given data block. Likewise, a reference symbol '2' is used, if the reference data block arrives one data block and one data value before the given data block, and so on. Thus, the reference symbol indicates a position of the reference data block relative to the given data block.

It will be appreciated that the size of a given data block may be considered optimal in many different ways. However, typically, it is desired to optimize, for example to minimize, the encoded data size after the duplication. Such optimization is usually best achieved by attempting to find a block size that is as large as possible that yet yields as many data blocks to be duplicated as possible. The next section describes an example of one way of determining a data block size that is nearly optimal. Other methods can also be used for determining optimal data block sizes, pursuant to the present disclosure.

Moreover, it will be appreciated that in cases where the data to be encoded is periodic, the optimal data block size is typically either the length of the period, a multiple of the length of the period, or some number whose multiple will be substantially equal to the length of the period.

If a block/period is repeated similarly many times consecutively, it is also possible, pursuant to the present disclosure, to multiply the selected element to be duplicated and the count of its repetitions. This may in some cases yield an efficient outcome when encoding data, but mostly this can be taken care of much easier and handier by entropy-coding the duplication symbols or by executing the duplication recursively.

For the sake of clarity, an example $9^{th}$ data block and its corresponding reference data block have been underlined and represented as follows:

0, 12, 41, 157, 180, 29, 0, 16, 243, 42, 42, 172, 8, 0, 69, 0, 0, 40, 120, 250, 64, 0, 118, 6, 206, 99, 62, 241, 193, 52, 172, 16, 17, 60, 34, 201, 192, 220, 189, 31, 183, 3, 31, 254, 192, 146, 80, 16, 0, 254, 185, 9, 0, 0, 0, 12, 41, 157, 180, 29, 0, 16, 243, 42, 42, 172, 8, 0, 69, 0, 0, 40, 121, 13, 64, 0, 118, 6, 206, 80, 62, 241, 193, 52, 172, 16, 17, 60, 34, 201, 192, 220, 189, 31, 183, 3, 31, 254, 201, 204, 80, 16, 1, 2, 175, 204, 0, 0, 0, 12, 41, 157, 180, 29, 0, 16, 243, 42, 42, 172, 8, 0, 69, 0, 0, 40, 121, 17, 64, 0, 118, 6, 206, 76, 62, 241, 193, 52, 172, 16, 17, 60, 34, 201, 192, 220, 189, 31, 183, 3, 31, 254, 209, 65, 80, 16, 1, 2, 168, 87, 0, 0, 0, 12, 41, 157, 180, 29, 0, 16, 243, 42, 42, 172, 8, 0, 69, 0, 0, 40, 121, 25, 64, 0, 118, 6, 206, 68, 62, 241, 193, 52, 172, 16, 17, 60, 34, 201, 192, 220, 189, 31, 183, 3, 31, 254, 221, 164, 80, 16, 1, 2, 155, 244, 0, 0, 0, 12, 41, 157, 180, 29, 0, 16, 243, 42, 42, 172, 8, 0, 69, 0, 0, 40, 121, 67, 64, 0, 118, 6, 206, 26, 62, 241, 193, 52, 172, 16, 17, 60, 34, 201, 192, 220, 189, 31, 183, 3, 31, 254, 233, 149, 80, 16, 1, 2, 144, 3, 0, 0

It will be appreciated that the actual reference data block is typically got from the decoded data, but, because this data is now coded losslessly, then also the original data values can be used for reference data blocks. As the reference data block arrives 48 data values before the example data block, a reference symbol '48' is assigned for the example data block.

The first index of the reference data block is optionally calculated, in this example, using the data-value-accurate reference indexing by using a following equation:

first_index_of_reference_data_block=first_index_of_current_data_block+block_size+reference_symbol−number_of_nearest_reference.

With this example for the $9^{th}$ data block, the equation get values such as:

$$56+7+48-1=2,$$

wherein the first_index_of_current_data_block is calculated from a following equation:

first_index_of_current_data_block=(number_of_current_data_block−1)*block_size, wherein the number_of_current_data_block is 9 and the block_size is 7, for example. The reference symbol, namely "48", of the $9^{th}$ data block have been underlined also from the reference symbols after the next chapter.

It will be appreciated that a first data block does not have a corresponding reference data block, and therefore, is not assigned a reference symbol. However, the last data block is assigned its corresponding reference symbol. It will also be appreciated that the last data block is incomplete, and therefore, data values of only four first data elements of the reference data block are used to code the last data block. Thus, 38 reference symbols are assigned as follows:

0, 0, 0, 0, 0, 0, 31, 48, 48, 48, 48, 48, 48, 48, 48, 48, 48, 48, 48, 48, 48, 48, 48, 48, 48, 48, 48, 48, 48, 48, 48, 48, 48, 48, 48, 48, 48, 34

The processing hardware of the encoder 10 then operates to calculate the most optimal block_size, for example, as follows:

<most common reference symbol>+<initial block size>−<reference symbol used for a nearest possible reference block>=48+7−1=54

It will be appreciated that, in this particular case, the optimal block size for this particular sequence of data is computed to be 54, which is also the length of the repeating period of this sequence of data. Other suitable block sizes would be, for example:

162, 108, 27, 18, 9, 6

Optionally, some other reference symbol that occurs often and has a smaller value than the most common reference symbol can be used in the most optimal block size equation instead of most common reference symbol to enable deduplication for higher amount of smaller blocks. It will also be appreciated that a number_of_a nearest_reference is beneficially not used as a most common reference number, because it might be affected with long continuum of similar data values and, consequently, it might be sub-optimal.

In this manner, the encoding method involves finding reoccurrences of data blocks in their own size, so that the data blocks do not need to be split into smaller data segments, namely akin to a known slide search method. It is also evident that there is no need to search for duplicate data blocks iteratively among all previously stored information with all lengths and all positions, which would waste valuable computing time and resources.

It will be appreciated that in case there is found a reasonably small number, but not 1, reference values, and a lot of used reference values, then it is often beneficial to be used instead of the most commonly used reference value when calculating the most optimal size for the block or packet. It will be further appreciated that the preliminary search is beneficial to execute with relatively small block or packet sizes, so that the short reference is not lost, but anyhow with sufficiently large block or packet size so that lengthy chain of same data values does not result to first reference value becoming the most common one. In an event that such a situation occurs, then it is beneficial to select some often occurring small value which however is bigger than 1, for calculating the most optimal size for the block or packet instead of the most commonly used reference.

Now, the processing hardware of the encoder 10 operates to perform a next run with the most optimal block size, namely a block size of 54. This results in five data blocks as follows:

0, 12, 41, 157, 180, 29, 0, 16, 243, 42, 42, 172, 8, 0, 69, 0, 0, 40, 120, 250, 64, 0, 118, 6, 206, 99, 62, 241, 193, 52, 172, 16, 17, 60, 34, 201, 192, 220, 189, 31, 183, 3, 31, 254, 192, 146, 80, 16, 0, 254, 185, 9, 0, 0, 0, 12, 41, 157, 180, 29, 0, 16, 243, 42, 42, 172, 8, 0, 69, 0, 0, 40, 121, 13, 64, 0, 118, 6, 206, 80, 62, 241, 193, 52, 172, 16, 17, 60, 34, 201, 192, 220, 189, 31, 183, 3, 31, 254, 201, 204, 80, 16, 1, 2, 175, 204, 0, 0, 0, 12, 41, 157, 180, 29, 0, 16, 243, 42, 42, 172, 8, 0, 69, 0, 0, 40, 121, 17, 64, 0, 118, 6, 206, 76, 62, 241, 193, 52, 172, 16, 17, 60, 34, 201, 192, 220, 189, 31, 183, 3, 31, 254, 209, 65, 80, 16, 1, 2, 168, 87, 0, 0, 0, 12, 41, 157, 180, 29, 0, 16, 243, 42, 42, 172, 8, 0, 69, 0, 0, 40, 121, 25, 64, 0, 118, 6, 206, 68, 62, 241, 193, 52, 172, 16, 17, 60, 34, 201, 192, 220, 189, 31, 183, 3, 31, 254, 221, 164, 80, 16, 1, 2, 155, 244, 0, 0, 0, 12, 41, 157, 180, 29, 0, 16, 243, 42, 42, 172, 8, 0, 69, 0, 0, 40, 121, 67, 64, 0, 118, 6, 206, 26, 62, 241, 193, 52, 172, 16, 17, 60, 34, 201, 192, 220, 189, 31, 183, 3, 31, 254, 233, 149, 80, 16, 1, 2, 144, 3, 0, 0

Hereinabove, changed data elements of partial reoccurrences of data blocks have been underlined for the sake of clarity.

Moreover, for the sake of clarity, 216 mask bits associated with 216 data elements of last four data blocks (54×4=216) are represented as follows:

0, 0, 0, 0, 0, 0, 0, 0, 0, 0, 0, 0, 0, 0, 0, 0, 0, 0, 1, 1, 0, 0, 0, 0, 0, 1, 0, 0, 0, 0, 0, 0, 0, 0, 0, 0, 0, 0, 0, 0, 0, 0, 0, 1, 1, 0, 0, 1, 1, 1, 1, 0, 0, 0, 0, 0, 0, 0, 0, 0, 0, 0, 0, 0, 0, 0, 0, 0, 0, 0, 0, 1, 0, 0, 0, 0, 0, 1, 0, 0, 0, 0, 0, 0, 0, 0, 0, 0, 0, 0, 0, 0, 0, 0, 0, 0, 0, 1, 1, 0, 0, 0, 0, 1, 1, 0, 0

0, 0, 0, 0, 0, 0, 0, 0, 0, 0, 0, 0, 0, 0, 0, 0, 0, 0, 1, 0, 0, 0, 0, 0, 1, 0, 0, 0, 0, 0, 0, 0, 0, 0, 0, 0, 0, 0, 0, 0, 0, 0, 0, 0, 1, 1, 0, 0, 0, 0, 1, 1, 0, 0

0, 0, 0, 0, 0, 0, 0, 0, 0, 0, 0, 0, 0, 0, 0, 0, 0, 0, 1, 0, 0, 0, 0, 0, 1, 0, 0, 0, 0, 0, 0, 0, 0, 0, 0, 0, 0, 0, 0, 0, 0, 0, 0, 0, 1, 1, 0, 0, 0, 0, 1, 1, 0, 0

Hereinabove, a mask bit associated with an unchanged data element is set to a '0' value, while a mask bit associated with a changed data element is set to a '1' value.

The processing hardware of the encoder 10 then operates to encode data values of the changed data elements, the mask bits associated with the changed and unchanged data elements, and reference symbols relating partial reoccurrences of mutually similar data blocks into a plurality of data streams to provide the encoded data (E2). In the example, the plurality of data streams includes a first data stream, a second data stream and a third data stream, as elucidated below.

The first data stream includes data values of 54 data elements of the first data block and data values of 27 changed data elements in subsequent data blocks (entropy=460.24 bits~=58 bytes), and is represented as follows:

0, 12, 41, 157, 180, 29, 0, 16, 243, 42, 42, 172, 8, 0, 69, 0, 0, 40, 120, 250, 64, 0, 118, 6, 206, 99, 62, 241, 193, 52, 172, 16, 17, 60, 34, 201, 192, 220, 189, 31, 183, 3, 31, 254, 192, 146, 80, 16, 0, 254, 185, 9, 0, 0, 121, 13, 80, 201, 204, 1, 2, 175, 204, 17, 76, 209, 65, 168, 87, 25, 68, 221, 164, 155, 244, 67, 26, 233, 149, 144, 3

The second data stream includes 27 bytes (216/8=27) denoting 216 mask bits associated with 216 data elements of the subsequent data blocks (entropy=117.41 bits ~=15 bytes), and is represented as follows:

0, 0, 12, 2, 0, 48, 15, 0, 0, 130, 0, 0, 12, 3, 0, 128, 32, 0, 0, 195, 0, 0, 32, 8, 0, 192, 48

The third data stream includes four reference symbols indicating corresponding reference data blocks for the subsequent data blocks (entropy=0 bits~=0 bytes), and is represented as follows:

1, 1, 1, 1

These reference symbols indicate that the first data block is a corresponding reference data block for a second data block, the second data block is a corresponding reference data block for a third data block, and so on. Herein, the reference symbols act as relative pointers that indicate positions of the data blocks relative to their corresponding reference data blocks or data packets.

As the reference symbols are sorted according to when they occur chronologically, the entropy produced by the third data stream is reduced considerably. In an alternative implementation, the reference symbols are optionally inserted into a table as they occur chronologically into an adaptive order. In such a case, the third data stream can be delta-coded efficiently.

In an event that it is desirable to refer only to a previous data block or data packet, namely a data block or data packet that arrives just before a given data block or data packet, the third data stream need not be written or transmitted in the encoded data (E2).

The same example can be implemented also by using one or more ODelta coding methods in such a way that the ODelta values are always computed from the inter-block data values. Thus, no separate mask bits, namely a second stream, are needed, neither are the changed values needed, namely the first stream. Instead, a third stream is used that contains alone corresponding information by using ODelta values. In the third stream of coded ODelta values, zero "0" values correspond to unchanged values, namely the zero bits of a mask, and the other coded ODelta values correspond to changed values, namely the bits with value '1' in the mask. However, such correspondences are to be computed in such a way that it can always be known directly by reading the current coded ODelta value whether change occurred or not, which ensures that the values can be decoded. When Odelta coding is used, the first and the second streams in the latest example above can be replaced by the following stream when "0" is used as the min value, "255" is used as the max value and "256" as the wrap value:

0, 12, 41, 157, 180, 29, 0, 16, 243, 42, 42, 172, 8, 0, 69, 0, 0, 40, 120, 250, 64, 0, 118, 6, 206, 99, 62, 241, 193, 52, 172, 16, 17, 60, 34, 201, 192, 220, 189, 31, 183, 3, 31, 254, 192, 146, 80, 16, 0, 254, 185, 9, 0, 0, 0, 0, 0, 0, 0, 0, 0, 0, 0, 0, 0, 0, 0, 0, 0, 0, 0, 1, 19, 0, 0, 0, 0, 0, 237, 0, 0, 0, 0, 0, 0, 0, 0, 0, 0, 0, 0, 0, 0, 0, 0, 0, 9, 58, 0, 0, 1, 4, 246, 195, 0, 0, 0, 0, 0, 0, 0, 0, 0, 0, 0, 0, 0, 0, 0, 0, 0, 0, 0, 0, 4, 0, 0, 0, 0, 0, 252, 0, 0, 0, 0, 0, 0, 0, 0, 0, 0, 0, 0, 0, 0, 0, 0, 0, 8, 117, 0, 0, 0, 0, 249, 139, 0, 0

0, 0, 0, 0, 0, 0, 0, 0, 0, 0, 0, 0, 0, 0, 0, 0, 0, 0, 8, 0, 0, 0, 0, 0, 248, 0, 0, 0, 0, 0, 0, 0, 0, 0, 0, 0, 0, 0, 0, 0, 0, 0, 12, 99, 0, 0, 0, 0, 243, 157, 0, 0

0, 0, 0, 0, 0, 0, 0, 0, 0, 0, 0, 0, 0, 0, 0, 0, 0, 0, 42, 0, 0, 0, 0, 0, 212, 0, 0, 0, 0, 0, 0, 0, 0, 0, 0, 0, 0, 0, 0, 0, 0, 0, 12, 241, 0, 0, 0, 0, 245, 15, 0, 0

The stream presented above can be compressed efficiently by using, for example, Range coding, SMRLE or VLC coding. It will be appreciated also that other compression methods can optionally be used in coding the entropy of the coded ODelta values in question.

The aforementioned methods of encoding are considerably more cost-efficient than known data de-duplication methods, because they are potentially capable of:
(i) finding partially duplicated data blocks or data packets apart from fully duplicated data blocks or data packets; and
(ii) encoding only changed data elements in the encoded data (E2).

Writing or transmitting only the changed data elements in the encoded data (E2) reduces a time needed for processing the encoded data (E2), an amount of encoded bytes within the encoded data (E2) and an entropy [1,2] of the encoded data (E2) as compared to the input data (D1). Thus, a considerably high data compression ratio is achieved as compared to the known data de-duplication methods.

When the input data (D1) is multi-dimensional data, an order in which data values are defined in data blocks is also an important property, pursuant to embodiments of the present disclosure. For illustration purposes only, there is now considered a two-dimensional (2D) image data having 16×16 data values, which can be divided into 16 data blocks in two ways, namely a first case where 16 data blocks have 1×16 or 16×1 data values each and a second case where 16 data blocks have 4×4 data values each. It will be appreciated that multi-dimensional features, namely spatial correlation between the data blocks, cannot be utilized as properly in the first case as can be utilized in the second case.

Furthermore, optionally, the additional encoding unit of the encoder 10 operates to compress further the three data streams, namely the first, second and third streams, by employing one or more suitable entropy encoding methods. Additionally or alternatively, optionally, the processing hardware of the encoder 10 operates to compress further the three data streams recursively using the aforementioned encoding process. This results in a high degree of data compression in the encoded data (E2).

The encoded data (E2) is then delivered from the encoder 10 to the decoder 20. The additional decoding unit of the decoder 20 then operates to decompress the encoded data (E2). Thereafter, the processing hardware of the decoder 20 operates to execute a decoding process pursuant to embodiments of the present disclosure. The decoded data (D3) so generated is exactly similar to the input data (D1), as a lossless mode of operation was used. Consequently, a sum of squared error between original data elements of the input data (D1) and data elements of the decoded data (D3) is zero.

There will now be described a lossy mode of operation of the encoder 10, using the same input data (D1) of the above example. In the lossy mode of operation, a data compression ratio can be improved even more.

Optionally, the input data (D1) is quantized prior to identifying at least partial reoccurrences of data blocks or data packets. In an example situation where a quantization value of four is used, 38 reference symbols assigned with respect to the initial block size of seven are represented as follows:

1, 0, 0, 0, 0, 2, 33, 48, 48, 48, 48, 48, 48, 48, 48, 48, 48, 48, 48, 48, 48, 48, 48, 48, 48, 48, 48, 48, 48, 48, 48, 48, 48, 48, 48, 48, 48, 50

In this example situation, the most optimal block size is 54.

The processing hardware of the encoder 10 then operates to encode the data values of the changed data elements, the mask bits and reference symbols into three data streams to provide the encoded data (E2), as elucidated below.

A first data stream includes quantized data values of 54 data elements of the first data block and quantized data values of 25 changed data elements in the subsequent data blocks, and is represented as follows:

0, 3, 10, 39, 45, 7, 0, 4, 60, 10, 10, 43, 2, 0, 17, 0, 0, 10, 30, 62, 16, 0, 29, 1, 51, 24, 15, 60, 48, 13, 43, 4, 4, 15, 8, 50, 48, 55, 47, 7, 45, 0, 7, 63, 48, 36, 20, 4, 0, 63, 46, 2, 0, 0, 3, 20, 50, 51, 0, 43, 51, 4, 19, 52, 16, 42, 21, 6, 17, 55, 41, 38, 61, 16, 6, 58, 37, 36, 0

A second data stream includes 27 bytes denoting 216 mask bits associated with 216 data elements of the subsequent data blocks, and is represented as follows:

0, 0, 8, 2, 0, 48, 14, 0, 0, 130, 0, 0, 12, 3, 0, 128, 32, 0, 0, 195, 0, 0, 32, 8, 0, 192, 48

A third data stream includes four reference symbols indicating corresponding reference data blocks for the subsequent data blocks, and is represented as follows:

1, 1, 1, 1

When required, the processing hardware of the decoder 20 operates to decode the encoded data (E2), namely the aforementioned three data streams, to generate the decoded data (D3). The decoded data (D3) so generated is represented as follows:

0, 12, 40, 156, 180, 28, 0, 16, 240, 40, 40, 172, 8, 0, 68, 0, 0, 40, 120, 248, 64, 0, 116, 4, 204, 96, 60, 240, 192, 52, 172, 16, 16, 60, 32, 200, 192, 220, 188, 28, 180, 0, 28, 252, 192, 144, 80, 16, 0, 252, 184, 8, 0, 0, 0, 12, 40, 156, 180, 28, 0, 16, 240, 40, 40, 172, 8, 0, 68, 0, 0, 40, 120, 12, 64, 0, 116, 4, 204, 80, 60, 240, 192, 52, 172, 16, 16, 60, 32, 200, 192, 220, 188, 28, 180, 0, 28, 252, 200, 204, 80, 16, 0, 0, 172, 204, 0, 0, 0, 12, 40, 156, 180, 28, 0, 16, 240, 40, 40, 172, 8, 0, 68, 0, 0, 40, 120, 16, 64, 0, 116, 4, 204, 76, 60, 240, 192, 52, 172, 16, 16, 60, 32, 200, 192, 220, 188, 28, 180, 0, 28, 252, 208, 64, 80, 16, 0, 0, 168, 84, 0, 0, 0, 12, 40, 156, 180, 28, 0, 16, 240, 40, 40, 172, 8, 0, 68, 0, 0, 40, 120, 24, 64, 0, 116, 4, 204, 68, 60, 240, 192, 52, 172, 16, 16, 60, 32, 200, 192, 220, 188, 28, 180, 0, 28, 252, 220, 164, 80, 16, 0, 0, 152, 244, 0, 0, 0, 12, 40, 156, 180, 28, 0, 16, 240, 40, 40, 172, 8, 0, 68, 0, 0, 40, 120, 64, 64, 0, 116, 4, 204, 24, 60, 240, 192, 52, 172, 16, 16, 60, 32, 200, 192, 220, 188, 28, 180, 0, 28, 252, 232, 148, 80, 16, 0, 0, 144, 0, 0, 0

Hereinabove, the five data blocks have been shown separated, and changed data elements of partial reoccurrences of data blocks have been underlined for the sake of clarity only.

The sum of squared error between the original data elements of the input data (D1) and the data elements of the decoded data (D3) is 535. This corresponds to some data loss between the input data (D1) and the decoded data (D3).

DEFINING REFERENCE SYMBOLS

Optionally, a reference symbol '0' is used to indicate non-duplicate data blocks or data packets, namely data blocks or data packets that are not duplicates of any previous data block or data packet.

Optionally, when there are 'N' different reference data blocks or data packets, reference symbols '1' to 'N' are used to indicate partially duplicate data blocks or data packets, namely data blocks or data packets that are partial duplicates of their respective reference data blocks or data packets. Herein, 'N' is any positive integer greater than 1.

In the previous examples described in the foregoing, the reference symbol '0' was not used, as none of the data blocks was a non-duplicate data block or data packet. Instead, the reference symbol '1' was used, as each of the subsequent data blocks was a partial duplicate of its corresponding reference data block.

Moreover, when there are multiple reference data blocks or data packets available for a given data block or data packet, a reference data block or data packet can be selected from amongst the multiple reference data blocks or data packets. During selection, a distance of the reference data block or data packet relative to the given data block or data packet is beneficially taken into account to find a probable reference symbol with a lower value, without compromising on a match between the selected reference data block or data packet and the given data block or data packet.

Optionally, when the input data (D1) is large and/or there is a large amount of redundancy in the input data (D1), separate reference symbols are used for fully duplicate data blocks or data packets, namely data blocks or data packets that are exact duplicates of their respective reference data blocks or data packets.

In one implementation of the encoder 10, when there are 'N' different reference data blocks or data packets, the reference symbols are optionally defined as follows:
(i) the reference symbol '0' is used to indicate non-duplicate data blocks or data packets;
(ii) the reference symbols '1' to 'N' are used to indicate partially duplicate data blocks or data packets; and
(iii) reference symbols '1+N' to 'N+N' are used to indicate fully duplicate data blocks or data packets.

For illustration purposes herein, there will now be considered an example wherein four reference data blocks are identified in the input data (D1). These four reference data blocks are assigned reference symbols as follows:
reference symbol '1' to a first reference data block;
reference symbol '2' to a second reference data block;
reference symbol '3' to a third reference data block; and
reference symbol '4' to a fourth reference data block.

In this example, value of 'N' is four (N=4).

Now, if a fifth data block in the input data (D1) is a partial duplicate of the second reference data block, the fifth data block is represented by using the reference symbol '2'. If a sixth data block in the input data (D1) is a full duplicate of the second reference data block, the sixth data block is represented by using the reference symbol '6', namely '2+N'.

In an alternative implementation, a one-bit symbol is optionally used to indicate whether a given data block or data packet is a full duplicate or a partial duplicate. The one-bit symbol is used in addition to a reference symbol for the given data block or data packet. Herein, the reference symbol indicates a corresponding reference data block or data packet for the given data block or data packet, while the one-bit symbol indicates whether the given data block or data packet is a full duplicate or a partial duplicate of the corresponding reference data block or data packet. The one-bit symbol has two values, namely '0' and '1'. For example, the value '0' of the one-bit symbol can be used to indicate a partial duplicate, while the value '1' of the one-bit symbol can be used to indicate a full duplicate, or vice versa.

In yet other alternative implementations, the partially duplicate data blocks or data packets can be defined by using block indexes, data indexes, motion vectors, database references, encoding methods, and so forth.

Optionally, when separate reference symbols are not used for fully duplicate data blocks or data packets, then mask bits associated with all unchanged data elements of the fully duplicate data blocks or data packets are set to a '0' value.

On the other hand, when separate reference symbols are used to indicate fully duplicate data blocks or data packets, the fully duplicate data blocks or data packets do not need mask bits. Likewise, when separate reference symbols are used to indicate non-duplicate data blocks or data packets, the non-duplicate data blocks or data packets do not need mask bits.

Moreover, optionally, the mask bits are encoded by using a database, as described in patent application GB 1222240.2, U.S. Ser. No. 13/715,405, hereby incorporated by reference. When there is a high probability that the mask bits reoccur, the data compression ratio is susceptible to being improved by delivering a reference to the mask bits, as compared to entropy-encoding the mask bits as such.

Next, embodiments of the present disclosure will be further described with reference to the drawings, namely FIG. 2 to FIG. 5B.

Figure 2:
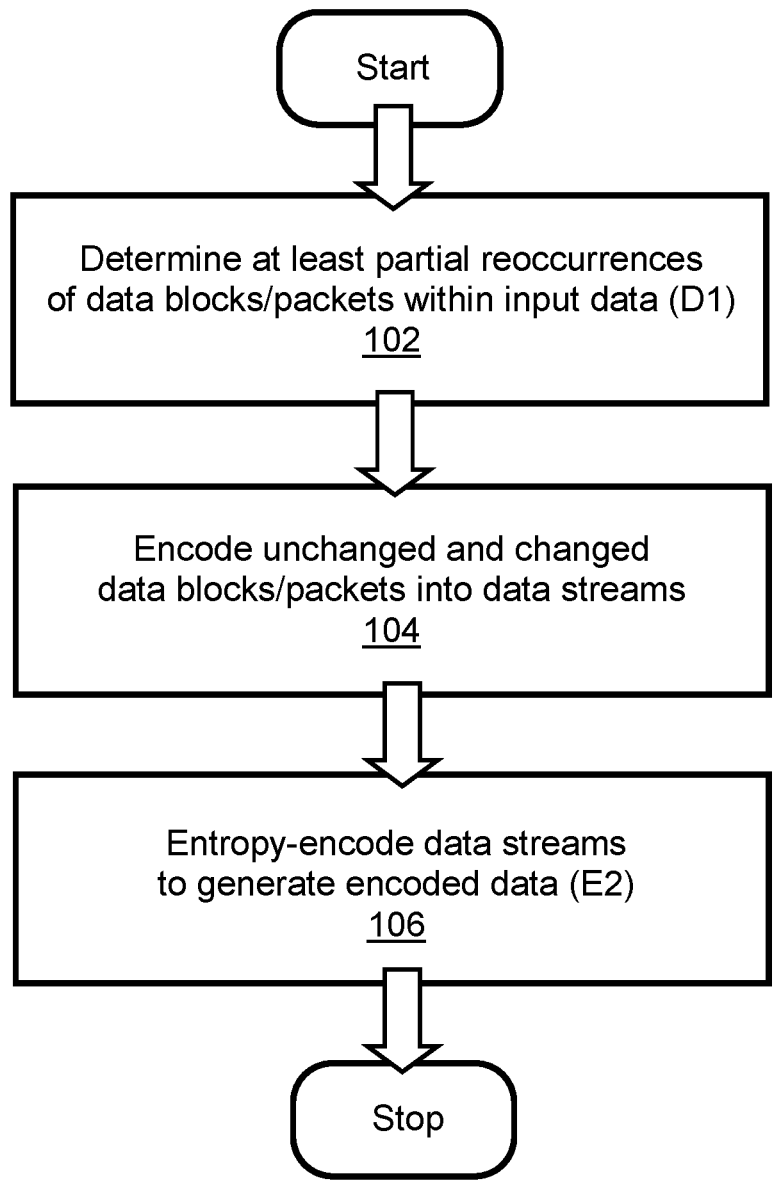
FIG. 2 is an illustration of steps of a method of encoding input data (D1) to generate corresponding encoded data (E2), in accordance with an embodiment of the present disclosure.

FIG. 2 is an illustration of steps of a method of encoding input data (D1) to generate corresponding encoded data (E2), in accordance with an embodiment of the present disclosure. The method is depicted as a collection of steps in a logical flow diagram, which represents a sequence of steps that can be implemented in hardware, software, or a combination thereof.

At a step 102, at least partial reoccurrences of data blocks or data packets within the input data (D1) are determined.

At a step 104, unchanged and changed data blocks or data packets are encoded by employing at least one reference symbol and a plurality of mask bits. As described earlier, the at least one reference symbol is employed to indicate at least partial reoccurrences of mutually similar data blocks or data packets and/or to indicate whether or not there are reoccurrences of mutually similar data blocks or data packets within the input data (D1). Additionally, the change symbols implemented for examples as a plurality of mask bits are employed to indicate changed and unchanged data elements of partial reoccurrences of data blocks or data packets and also changed values within the input data (D1). Alternatively, delta values are used, for example in a manner as described in the foregoing.

In accordance with the step 104, the at least one reference symbol and the plurality of change symbols are encoded into a plurality of data streams, as described earlier.

Figure 3A:
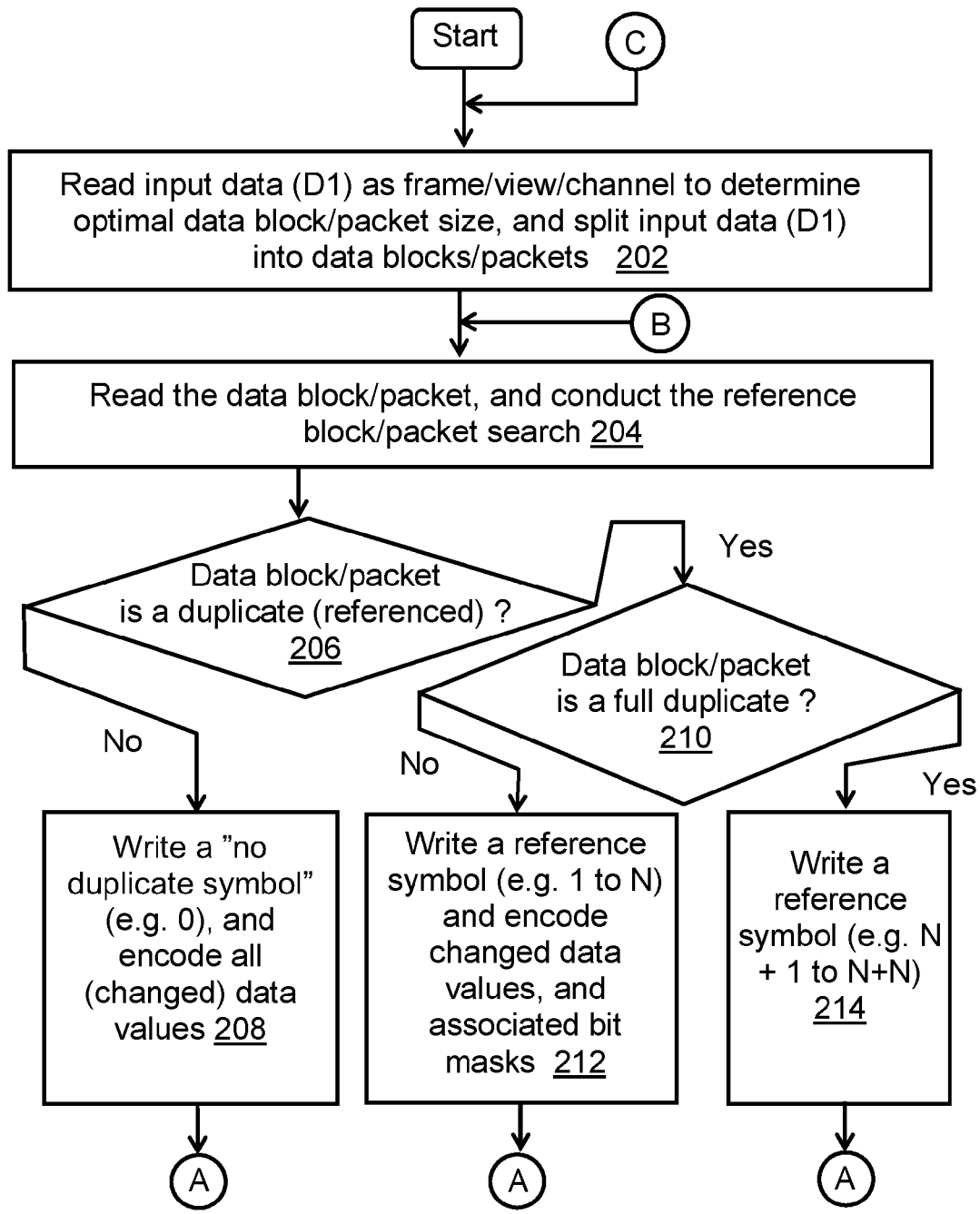

An encoding processing of the steps 102 and 104 has been described in conjunction with FIGS. 3A and 3B.

Next, at a step 106, the plurality of data streams are entropy-encoded to generate the encoded data (E2).

The steps 102 to 106 are only illustrative and other alternatives can also be provided where one or more steps are added, one or more steps are removed, or one or more steps are provided in a different sequence without departing from the scope of the claims herein.

FIGS. 3A and 3B collectively are an illustration of steps of the encoding processing, in accordance with an embodiment of the present disclosure.

At a step 202, a given data frame/view/channel of the input data (D1) is read to determine a most optimal size for data blocks or data packets, as described earlier.

In accordance with the step 202, the given data frame/view/channel is split into data blocks or data packets as per the most optimal size for the data blocks or data packets.

At a step 204, the data blocks or data packets are read to conduct a search for their corresponding reference data blocks or data packets.

Next, at a step 206, for a given data block or data packet in the given data frame/view/channel, it is determined whether or not the given data block or data packet is a duplicate of a reference data block or data packet.

If, at the step 206, it is determined that the given data block or data packet is not a duplicate, a step 208 is performed. At the step 208, a "no duplicate" reference symbol is written for the given data block or data packet. In one example, the "no duplicate" reference symbol is defined as a reference symbol '0'. Additionally, all data values of the given data block or data packet are encoded into the encoded data (E2).

If, at the step 206, it is determined that the given data block or data packet is a duplicate of a reference data block or data packet, a step 210 is performed. At the step 210, it is determined whether the given data block or data packet is a full duplicate or a partial duplicate of the reference data block or data packet. When the lossy mode of operation is used, the step 210 is performed as per a quality level set for the lossy mode of operation.

If, at the step 210, it is determined that the given data block or data packet is a partial duplicate, a step 212 is performed. At the step 212, a reference symbol indicating the reference data block or data packet is written for the given data block or data packet. The reference symbol is employed as a pointer indicating a position of the reference data block or data packet relative to the given data block or data packet. In one example, the reference symbol is selected from the reference symbols '1' to 'N', when there are 'N' different reference data blocks or data packets. Additionally, data values of changed data elements of the given data block or data packet and their associated mask bits are encoded into the encoded data (E2).

If, at the step 210, it is determined that the given data block or data packet is a full duplicate, a step 214 is performed. At the step 214, a reference symbol indicating the reference data block or data packet is written for the given data block or data packet. In one example, the reference symbol is selected from the reference symbols '1+N' to 'N+N', when there are 'N' different reference data blocks or data packets. In another example, a one-bit symbol indicating a full duplicate is written in addition to the reference symbol.

A step 216 follows the steps 208, 212 and 214. At the step 216, it is determined whether or not a next data block or data packet exists in the given data frame/view/channel. If it is determined that a next data block or data packet exists, the encoding processing restarts at the step 204. Otherwise, if it is determined that no next data block or data packet exists in the given data frame/view/channel, a step 218 is performed.

At the step 218, it is determined whether or not a next data frame/view/channel exists in the input data (D1). If it is determined that a next data frame/view/channel exists, the encoding processing restarts at the step 202. Otherwise, if it is determined that no next data frame/view/channel exists in the input data (D1), the encoding processing stops.

Moreover, an amount of background memory allocated for the encoding processing is only as large as an amount of data elements in a current data block or data packet multiplied with the number of possible references (namely block or packet accurate reference indexing) or summed with the number of possible references minus one (namely data value accurate reference indexing). In minimum, it is a memory of one data block or packet. Moreover, a result of the encoding processing, namely, the encoded data (E2), can be written or transmitted directly into an original memory. This means that no separate transfer memories are required. Therefore, the method is capable of functioning as an in-place operation, and is highly cost-effective. The method, for example, can be used in inexpensive consumer electronic media products, such as smart phones, MP3 players, tablet computers, televisions, audio high-fidelity ("hifi") equipments, e-books and similar.

The steps 202 to 218 are only illustrative and other alternatives can also be provided where one or more steps are added, one or more steps are removed, or one or more steps are provided in a different sequence without departing from the scope of the claims herein. For example, in an alternative implementation where separate reference symbols are not used for fully duplicate data blocks or data packets, the steps 210 and 214 are removed. Now, if, at the step 206, it is determined that the given data block or data packet is a duplicate of a reference data block or data packet, the step 212 is performed instead of the step 210.

Embodiments of the present disclosure provide a computer program product comprising a non-transitory (namely non-transient) computer-readable storage medium having computer-readable instructions stored thereon, the computer-readable instructions being executable by a computerized device comprising processing hardware to execute the method as described in conjunction with FIGS. 2 and 3A-B. The computer-readable instructions are optionally downloadable from a software application store, for example, from an "App store" to the computerized device.

Figure 4:
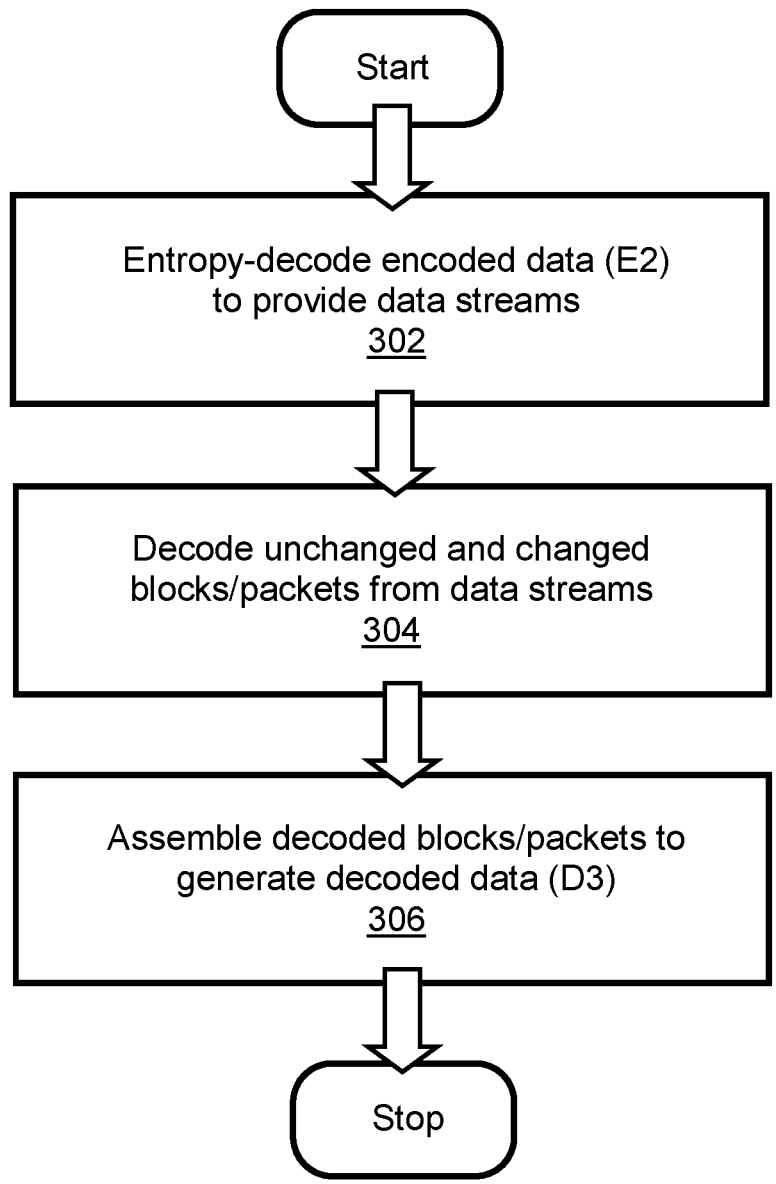
FIG. 4 is an illustration of steps of a method of decoding encoded data (E2) to generate corresponding decoded data (D3), in accordance with an embodiment of the present disclosure.

FIG. 4 is an illustration of steps of a method of decoding encoded data (E2) to generate corresponding decoded data (D3), in accordance with an embodiment of the present disclosure. The method is depicted as a collection of steps in a logical flow diagram, which represents a sequence of steps that can be implemented in hardware, software, or a combination thereof.

At a step 302, the encoded data (E2) is entropy-decoded to provide a plurality of data streams. As described earlier, the plurality of data streams include one or more of:
(i) a first data stream that includes data values of at least one reference data block and/or data packet and data values of changed data elements of subsequent data blocks;
(ii) a second data stream that includes a plurality of mask bits; and/or
(iii) a third data stream that includes at least one reference symbol.

At a step 304, unchanged and changed data blocks are decoded from the plurality of data streams. In accordance with the step 304, the at least one reference symbol and the plurality of change symbols are decoded to generate data for at least partial reoccurrences of data blocks or data packets, and to generate data for changed data elements of partial reoccurrences of data blocks or data packets.

Figure 5A:
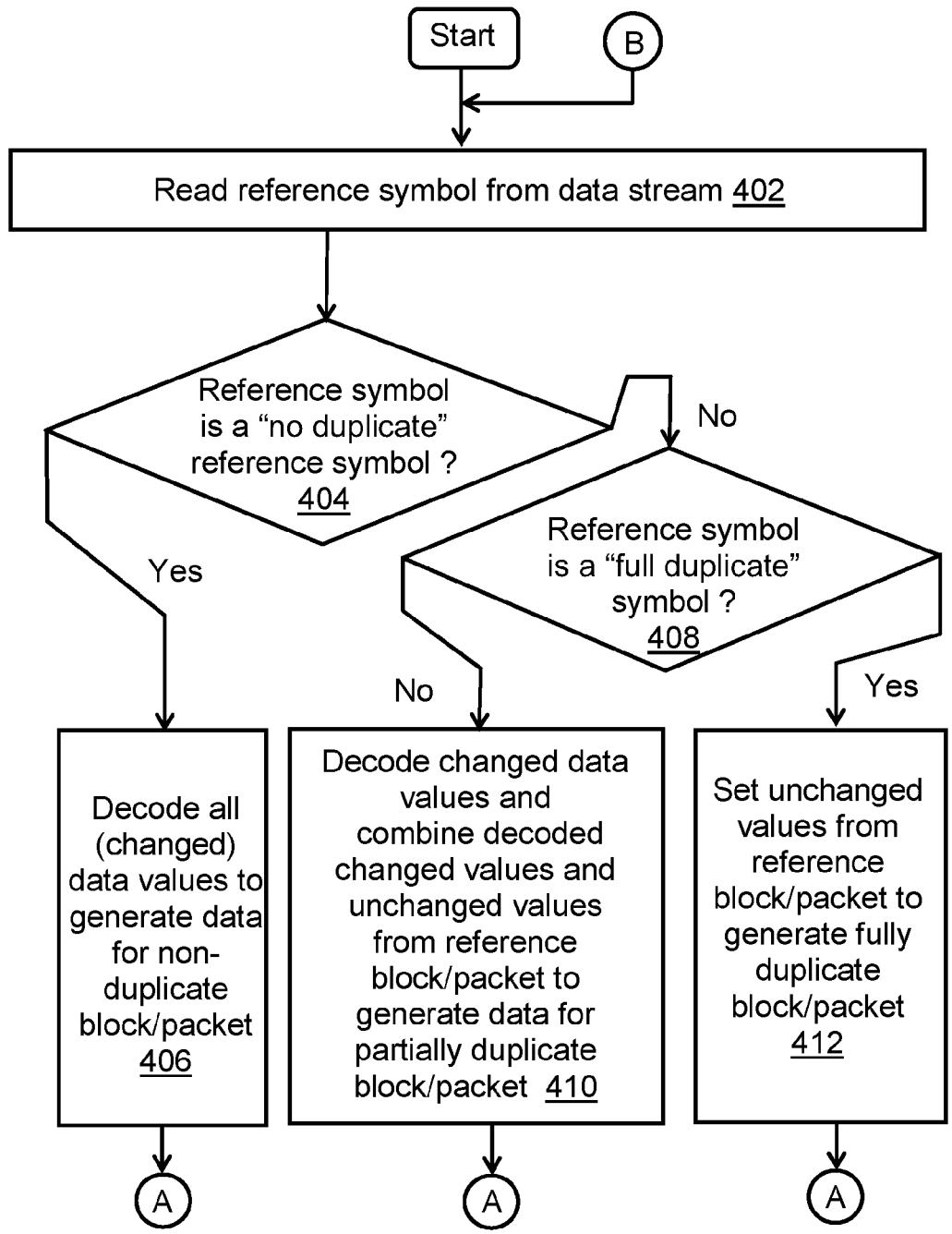
FIGS. 5A and 5B collectively are an illustration of steps of a decoding process, in accordance with an embodiment of the present disclosure.
Figure 5B:
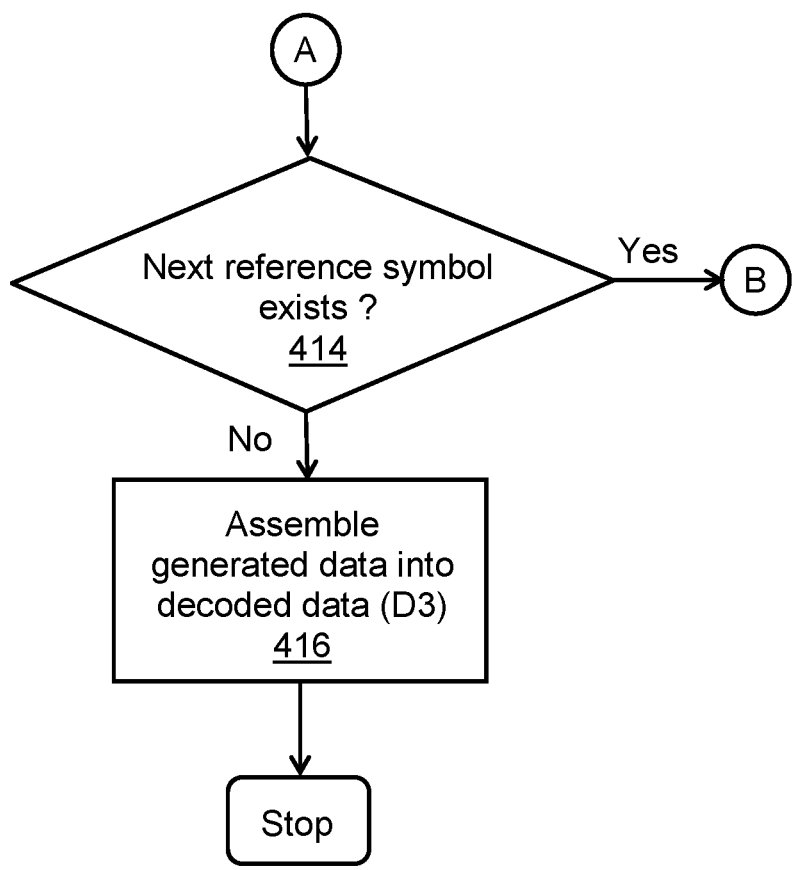

A decoding processing of the step 304 has been described in conjunction with FIGS. 5A and 5B.

Next, at a step 306, the data generated for the at least partial reoccurrences of data blocks or data packets and the data generated for the changed data elements of the partial reoccurrences of data blocks or data packets are assembled to generate the decoded data (D3).

The steps 302 to 306 are only illustrative and other alternatives can also be provided where one or more steps are added, one or more steps are removed, or one or more steps are provided in a different sequence without departing from the scope of the claims herein.

FIGS. 5A and 5B collectively are an illustration of steps of the decoding processing, in accordance with an embodiment of the present disclosure.

At a step 402, a given reference symbol is read from the third data stream provided in the encoded data (E2).

At a step 404, it is determined whether or not the given reference symbol is a "no duplicate" reference symbol. In other words, it is determined whether or not the given reference symbol corresponds to a non-duplicate data block or data packet.

If, at the step 404, it is determined that the given reference symbol is a "no duplicate" reference symbol, a step 406 is performed. At the step 406, all data values of the non-duplicate data block or data packet are decoded to generate data for the non-duplicate data block or data packet.

If, at the step 404, it is determined that the given reference symbol is not a "no duplicate" reference symbol, a step 408 is performed. At the step 408, it is determined whether or not the given reference symbol is a "full duplicate" reference symbol. In other words, it is determined whether or not the given reference symbol corresponds to a fully duplicate data block or data packet.

If, at the step 408, it is determined that the given reference symbol is not a "full duplicate" reference symbol, a step 410 is performed. At the step 410, mask bits associated with data elements of a partially duplicate data block or data packet are checked to decode data values of changed data elements of the partially duplicate data block or data packet. Additionally, data values of unchanged elements are taken from a reference data block or data packet to which the given reference symbol points. In accordance with the step 410, the data values of the unchanged elements are combined with the data values of the changed data elements to generate data for the partially duplicate data block or data packet.

If, at the step 408, it is determined that the given reference symbol is a "full duplicate" reference symbol, a step 412 is performed. At the step 412, data values of unchanged elements are taken from the reference data block to which the given reference symbol points. The data values of the unchanged elements are set to generate data for a fully duplicate data block or data packet.

A step 414 follows the steps 406, 410 and 412. At the step 414, it is determined whether or not a next reference symbol exists in the third data stream. If it is determined that a next reference symbol exists, the decoding processing restarts at the step 402.

Otherwise, if it is determined that no next reference symbol exists, a step 416 is performed. At the step 416, the data generated for the data blocks or data packets at the steps 406, 410 and 412 is assembled to generate the decoded data (D3).

It will be appreciated that it is possible that a channel, a view or a frame is updated separately whenever decoding such a portion of the data is completed, irrespective of whether or not all data is completed.

The steps 402 to 416 are only illustrative and other alternatives can also be provided where one or more steps are added, one or more steps are removed, or one or more steps are provided in a different sequence without departing from the scope of the claims herein.

Embodiments of the present disclosure provide a computer program product comprising a non-transitory (namely non-transient) computer-readable storage medium having computer-readable instructions stored thereon, the computer-readable instructions being executable by a computerized device comprising processing hardware to execute the method as described in conjunction with FIGS. 4 and 5A-B. The computer-readable instructions are optionally downloadable from a software application store, for example, from an "App store" to the computerized device.

Modifications to embodiments of the invention described in the foregoing are possible without departing from the scope of the invention as defined by the accompanying claims. Expressions such as "including", "comprising", "incorporating", "consisting of", "have", "is" used to describe and claim the present invention are intended to be construed in a non-exclusive manner, namely allowing for items, components or elements not explicitly described also to be present. Reference to the singular is also to be construed to relate to the plural. Numerals included within parentheses in the accompanying claims are intended to assist understanding of the claims and should not be construed in any way to limit subject matter claimed by these claims.

APPENDIX

| [1] | Entropy (information theory) - Wikipedia, the free encyclopedia (accessed Sep. 27, 2013). URL: | http://en.wikipedia.org/wiki/ Entropy %28information theory%29 |
| --- | --- | --- |
| [2] | Shannon, Claude E. (1948) (accessed Nov. 28, 2012) A Mathematical Theory of Communication. URL: | http://cm.bell-labs.com/cm/ms/what/ shannonday/shannon1948.pdf |
| [3] | Lossless compression - Wikipedia, the free encyclopedia (accessed Sep. 27, 2013). URL: | http//en.wikipedia.org/wiki/ Lossless compression |
| [4] | Lossy compression - Wikipedia, the free encyclopedia (accessed Sep. 27, 2013). URL: | http://en.wikipedia.org/wiki/ Lossy compression |

APPENDIX-continued

| [5] | Data deduplication - Wikipedia, the free encyclopedia (accessed Sep. 27, 2013). URL: | http://en.wikipedia.org/wiki/Data_deduplication |
| [6] | Hypertext Transfer Protocol -- HTTP/1.1 (accessed Sep. 27, 2013). URL: | http://www.w3.org/Protocols/rfc2616/rfc2616.html |
| [7] | Real-Time Messaging Protocol (RTMP) specification | Adobe Developer Connection (accessed Sep. 27, 2013). URL: | http://www.adobe.com/devnet/rtmp.html |
| [8] | Windows Azure: Microsoft's Cloud Platform | Cloud Hosting | Cloud Services (accessed Sep. 27, 2013). URL: | http://www.windowsazure.com/en-us/ |
| [9] | Moore's law - Wikipedia, the free encyclopedia (accessed Sep. 27, 2013). URL: | http://en.wikipedia.org/wiki/moore%27s_law |
| [10] | U.S. patent U.S. Pat. No. 7,643,505B1 (Colloff): "Method and system for real time compression and decompression" | |

We claim:

1. An encoder for encoding input data to generate corresponding encoded data, characterized in that the encoder includes data processing hardware which is operable:
    (a) to determine at least partial reoccurrences of data blocks or data packets within the input data, wherein the data blocks or data packets each include a plurality of bytes;
    (b) to employ at least one reference symbol to relate reoccurrences of mutually similar data blocks or data packets within the input data, and/or to indicate whether or not there are reoccurrences of mutually similar data blocks or data packets within the input data wherein a given reference symbol is employed as a relative pointer that indicates a position of a given data block or data packet relative to its corresponding reference data block or data packet, or is employed to indicate a position of the reference data block or data packet relative to the given data block or data packet;
    (c) to employ a plurality of change symbols to indicate changed and unchanged data elements of partial reoccurrences of data blocks or data packets within the input data, wherein the plurality of change symbols are implemented by way of mask bits or a change of data values of the data elements; and
    (d) to encode into the encoded data:
    (i) the at least one reference symbol,
    (ii) the plurality of change symbols, and
    (iii) data values indicative of the changed data elements or data values indicative of the change of data values of the changed data elements, when the plurality of change symbols are implemented by way of mask bits.

2. The encoder as claimed in claim 1, characterized in that the data processing hardware is operable to represent one or more unchanged data elements of a given data block or data packet by using one or more values indicative of no change, wherein the one or more values are different to those present in the input data.

3. The encoder as claimed in claim 1, characterized in that the data processing hardware is operable to encode into a plurality of data streams to provide the encoded data:
    (i) the at least one reference symbol,
    (ii) the plurality of change symbols, and
    (iii) the data values indicative of the changed data elements or the data values indicative of the change of data values of the changed data elements, when the plurality of change symbols are implemented by way of mask bits.

4. The encoder as claimed in claim 1, characterized in that the data processing hardware is operable to encode the input data provided as at least one of: one-dimensional data, multi-dimensional data, audio data, image data, video data, sensor data, text data, binary data, medical data.

5. The encoder as claimed in claim 1, characterized in that the encoder includes an additional encoding unit for encoding into the encoded data at least a portion of:
    (i) the at least one reference symbol,
    (ii) the plurality of change symbols, and
    (iii) the data values indicative of the changed data elements or the data values indicative of the change of data values of the changed data elements, when the plurality of change symbols are implemented by way of mask bits,
    wherein the additional encoding unit is operable to employ at least one of: entropy modifying encoding, delta encoding, ODelta encoding, range encoding, Run Length Encoding (RLE), Split RLE (SRLE), interpolation encoding.

6. The encoder as claimed in claim 1, characterized in that the data processing hardware is operable to determine a most optimal size for the data blocks or data packets when processing the input data, and to provide, within the encoded data, information indicative of the most optimal size for the data blocks or data packets.

7. A method of encoding input data generate corresponding encoded data, wherein the method includes processing the input data, characterized in that the method includes:
    (a) determining at least partial reoccurrences of data blocks or data packets within the input data, wherein the data blocks or data packets each include a plurality of bytes;
    (b) employing at least one reference symbol to relate reoccurrences of mutually similar data blocks or data packets within the input data, and/or to indicate whether or not there are reoccurrences of mutually similar data blocks or data packets within the input data, wherein a given reference symbol is employed as a relative pointer that indicates a position of a given data block or data packet relative to its corresponding reference data block or data packet, or is employed to indicate a position of the reference data block or data packet relative to the given data block or data packet;
    (c) employing a plurality of change symbols to indicate changed and unchanged data elements of partial reoccurrences of data blocks or data packets within the input data, wherein the plurality of change symbols are implemented by way of mask bits or a change of data values of the data elements; and
    (d) encoding into the encoded data:
    (i) the at least one reference symbol,
    (ii) the plurality of change symbols, and
    (iii) data values indicative of the changed data elements or data values indicative of the change of data values of the changed data elements, when the plurality of change symbols are implemented by way of mask bits.

8. The method as claimed in claim 7, characterized in that the method includes representing one or more unchanged data elements of a given data block or data packet by using one or more values indicative of no change, wherein the one or more values are different to those present in the input data.

9. The method as claimed in claim 7, characterized in that the method includes encoding into a plurality of data streams to provide the encoded data:
(i) the at least one reference symbol,
(ii) the plurality of change symbols, and
(iii) the data values indicative of the changed data elements or the data values indicative of the change of data values of the changed data elements, when the plurality of change symbols are implemented by way of mask bits.

10. The method as claimed in claim 7, characterized in that the method includes encoding the input data provided as at least one of: one-dimensional data, multi-dimensional data, audio data, image data, video data, sensor data, text data, binary data, medical data.

11. The method as claimed in claim 7, characterized in that the method includes:
(e) employing an additional encoding unit for encoding into the encoded data at least a portion of:
(i) the at least one reference symbol,
(ii) the plurality of change symbols, and
(iii) the data values indicative of the changed data elements or the data values indicative of the change of data values of the changed data elements, when the plurality of change symbols are implemented by way of mask bits; and
(f) arranging for the additional encoding unit to employ at least one of: entropy modifying encoding, delta encoding, ODelta encoding, range encoding, Run Length Encoding (RLE), Split RLE (SRLE), interpolation encoding.

12. The method as claimed in claim 7, characterized in that the method includes:
(g) determining a most optimal size for the data blocks or data packets when processing the input data; and
(h) providing, within the encoded data, information indicative of the most optimal size for the data blocks or data packets.

13. A decoder for decoding encoded data to generate corresponding decoded data, characterized in that the decoder includes data processing hardware which is operable:
(a) to decode the encoded data to identify:
(i) at least one reference symbol,
(ii) a plurality of change symbols, the plurality of change symbols indicating changed and unchanged data elements of partial reoccurrences of data blocks or data packets within the decoded data, the plurality of change symbols being implemented by way of mask bits or a change of data values of the data elements, and;
(iii) data values indicative of the changed data elements or data values indicative of the change of data values of the changed data elements, when the plurality of change symbols are implemented by way of mask bits;
(b) to employ the at least one reference symbol to determine whether or not there are reoccurrences of mutually similar data blocks or data packets and to generate data for reoccurrences of mutually similar data blocks or data packets within the decoded data, wherein a given reference symbol is employed as a relative pointer that indicates a position of a given data block or data packet relative to its corresponding reference data block or data packet, or is employed to indicate a position of the reference data block or data packet relative to the given data block or data packet, and wherein the data blocks or data packets each include a plurality of bytes;
(c) to employ the plurality of change symbols to generate data for the changed data elements of the partial reoccurrences of data blocks or data packets within the decoded data; and
(d) to assemble the data generated for the reoccurrences of mutually similar data blocks or data packets and the data generated for the changed data elements of the partial reoccurrences of data blocks or data packets, to generate corresponding decoded data.

14. The decoder as claimed in claim 13, characterized in that the data processing hardware is operable to decode one or more unchanged data elements of a given data block or data packet from one or more values indicative of no change, wherein the one or more values are different to those present in the decoded data.

15. The decoder as claimed in claim 13, characterized in that the data processing hardware is operable to decode from a plurality of data streams provided within the encoded data:
(i) the at least one reference symbol,
(ii) the plurality of change symbols, and
(iii) the data values indicative of the changed data elements or the data values indicative of the change of data values of the changed data elements, when the plurality of change symbols are implemented by way of mask bits.

16. The decoder as claimed in claim 13, characterized in that the decoded data is provided as at least one of: one-dimensional data, multi-dimensional data, audio data, image data, video data, sensor data, text data, binary data, medical data.

17. The decoder as claimed in claim 13, characterized in that the decoder includes an additional decoding unit for decoding from the encoded data at least a portion of:
(i) the at least one reference symbol,
(ii) the plurality of change symbols, and
(iii) the data values indicative of the changed data elements or the data values indicative of the change of data values of the changed data elements, when the plurality of change symbols are implemented by way of mask bits,
wherein the additional decoding unit is operable to employ at least one of: entropy modifying decoding, delta decoding, ODelta decoding, range decoding, run length decoding, split run length decoding, interpolation decoding.

18. The decoder as claimed in claim 13, characterized in that the data processing hardware is operable to receive, within the encoded data, information indicative of a size of the data blocks or data packets.

19. A method of decoding encoded data to generate corresponding decoded data, wherein the method includes processing the encoded data, characterized in that the method includes:
(a) decoding the encoded data to identify:
(i) at least one reference symbol,
(ii) a plurality of change symbols the plurality of change symbols indicating changed and unchanged data elements of partial reoccurrences of data blocks or data packets within the decoded data, the plurality of change symbols being implemented by way of mask bits or a change of data values of the data elements, and
(iii) data values indicative of the changed data elements or data values indicative of the change of data values of the changed data elements, when the plurality of change symbols are implemented by way of mask bits;

(b) employing the at least one reference symbol to determine whether or not there are reoccurrences of mutually similar data blocks or data packets and to generate data for reoccurrences of mutually similar data blocks or data packets within the decoded data, wherein a given reference symbol is employed as a relative pointer that indicates a position of a given data block or data packet relative to its corresponding reference data block or data packet, or is employed to indicate a position of the reference data block or data packet relative to the given data block or data packet, and wherein the data blocks or data packets each include a plurality of bytes;

(c) employing the plurality of change symbols to generate data for the changed data elements of the partial reoccurrences of data blocks or data packets within the decoded data; and (d) assembling the data generated for the reoccurrences of mutually similar data blocks or data packets and the data generated for the changed data elements of the partial reoccurrences of data blocks or data packets, to generate corresponding decoded data.

20. The method as claimed in claim 19, characterized in that the method includes decoding one or more unchanged data elements of a given data block or data packet from one or more values indicative of no change, wherein the one or more values are different to those present in the decoded data.

21. The method as claimed in claim 19, characterized in that the method includes decoding from a plurality of data streams provided within the encoded data
(i) the at least one reference symbol,
(ii) the plurality of change symbols, and
(iii) the data values indicative of the changed data elements or the data values indicative of the change of data values of the changed data elements, when the plurality of change symbols are implemented by way of mask bits.

22. The method as claimed in claim 19, characterized in that the decoded data is provided as at least one of: one-dimensional data, multi-dimensional data, audio data, image data, video data, sensor data, text data, binary data.

23. The method as claimed in claim 19, characterized in that the method includes:
(e) employing an additional decoding unit for decoding from the encoded data at least a portion of:
(i) the at least one reference symbol:
(ii) the plurality of change symbols, and
(iii) the data values indicative of the changed data elements or the data values indicative of the change of data values of the changed data elements, when the plurality of change symbols are implemented by way of mask bits; and
(f) arranging for the additional decoding unit to employ at least one of: entropy modifying decoding, delta decoding, ODelta decoding, range decoding, run length decoding, split run length decoding, interpolation decoding.

24. The method as claimed in claim 19, characterized in that the method includes receiving, within the encoded data, information indicative of a size of the data blocks or data packets.

25. A computer program product comprising a non-transitory computer-readable storage medium having computer-readable instructions stored thereon, the computer-readable instructions being executable by a computerized device comprising processing hardware to execute a method comprising:

(a) determining at least partial reoccurrences of data blocks or data packets within the input data, wherein the data blocks or data packets each include a plurality of bytes;

(b) employing at least one reference symbol to relate reoccurrences of mutually similar data blocks or data packets within the input data, and/or to indicate whether or not there are reoccurrences of mutually similar data blocks or data packets within the input data, wherein a given reference symbol is employed as a relative pointer that indicates a position of a given data block or data packet relative to its corresponding reference data block or data packet, or is employed to indicate a position of the reference data block or data packet relative to the given data block or data packet;

(c) employing a plurality of change symbols to indicate changed and unchanged data elements of partial reoccurrences of data blocks or data packets within the input data, wherein the plurality of change symbols are implemented by way of mask bits or a change of data values of the data elements; and (d) encoding into the encoded data:
(i) the at least one reference symbol,
(ii) the plurality of change symbols, and
(iii) data values indicative of the changed data elements or data values indicative of the change of data values of the changed data elements, when the plurality of change symbols are implemented by way of mask bits.

26. A codec including at least one encoder for encoding input data to generate corresponding encoded data, characterized in that the encoder includes data processing hardware which is operable:

(a) to determine at least partial reoccurrences of data blocks or data packets within the input data, wherein the data blocks or data packets each include a plurality of bytes;

(b) to employ at least one reference symbol to relate reoccurrences of mutually similar data blocks or data packets within the input data, and/or to indicate whether or not there are reoccurrences of mutually similar data blocks or data packets within the input data, wherein a given reference symbol is employed as a relative pointer that indicates a position of a given data block or data packet relative to its corresponding reference data block or data packet, or is employed to indicate a position of the reference data block or data packet relative to the given data block or data packet;

(c) to employ a plurality of change symbols to indicate changed and unchanged data elements of partial reoccurrences of data blocks or data packets within the input data, wherein the plurality of change symbols are implemented by way of mask bits or a change of data values of the data elements; and (d) to encode into the encoded data:
(i) the at least one reference symbol,
(ii) the plurality of change symbols, and
(iii) data values indicative of the changed data elements or data values indicative of the change of data values of the changed data elements, when the plurality of change symbols are implemented by way of mask bits; and at least one decoder for decoding the encoded data to generate corresponding decoded data, characterized in that the decoder includes data processing hardware which is operable:
(a) to decode the encoded data to identify:
(i) at least one reference symbol,
(ii) a plurality of change symbols, the plurality of change symbols indicating changed and unchanged data elements of partial reoccurrences of data blocks or data packets within the decoded data, the plurality of change symbols being implemented by way of mask bits or a change of data values of the data elements, and
(iii) data values indicative of the changed data elements or data values indicative of the change of data values of the changed data elements, when the plurality of change symbols are implemented by way of mask bits;
(b) to employ the at least one reference symbol to determine whether or not there are reoccurrences of mutually similar data blocks or data packets and to generate data for reoccurrences of mutually similar data blocks or data packets within the decoded data, wherein a given reference symbol is employed as a relative pointer that indicates a position of a given data block or data packet relative to its corresponding reference data block or data packet, or is employed to indicate a position of the reference data block or data packet relative to the given data block or data packet, and wherein the data blocks or data packets each include a plurality of bytes;
(c) to employ the plurality of change symbols to generate data for the changed data elements of the partial reoccurrences of data blocks or data packets within the decoded data; and
(d) to assemble the data generated for the reoccurrences of mutually similar data blocks or data packets and the data generated for the changed data elements of the partial reoccurrences of data blocks or data packets, to generate corresponding decoded data.

* * * * *